US011743615B2

(12) United States Patent
Watanabe et al.

(10) Patent No.: US 11,743,615 B2
(45) Date of Patent: Aug. 29, 2023

(54) LIGHT SOURCE DEVICE, IMAGE SENSOR, AND SENSING MODULE

(71) Applicant: Sony Semiconductor Solutions Corporation, Kanagawa (JP)

(72) Inventors: Shota Watanabe, Tokyo (JP); Takuya Sano, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 12 days.

(21) Appl. No.: 17/255,839

(22) PCT Filed: Jun. 17, 2019

(86) PCT No.: PCT/JP2019/023867
§ 371 (c)(1),
(2) Date: Dec. 23, 2020

(87) PCT Pub. No.: WO2020/026616
PCT Pub. Date: Feb. 6, 2020

(65) Prior Publication Data
US 2021/0258521 A1    Aug. 19, 2021

(30) Foreign Application Priority Data
Aug. 1, 2018  (JP) ................................ 2018-144925

(51) Int. Cl.
*H04N 25/709* (2023.01)
*G01S 17/894* (2020.01)
(Continued)

(52) U.S. Cl.
CPC .......... *H04N 25/709* (2023.01); *G01S 7/497* (2013.01); *G01S 17/894* (2020.01); *H01S 5/024* (2013.01)

(58) Field of Classification Search
None
See application file for complete search history.

(56) References Cited

U.S. PATENT DOCUMENTS 6,415,241 B1 * 7/2002 Yoshida .................. G01C 3/08
702/158
2015/0062582 A1   3/2015 Adachi et al.
(Continued)

FOREIGN PATENT DOCUMENTS

CN    110998365 A    4/2020
JP    H0886622 A    4/1996
(Continued)

OTHER PUBLICATIONS

International Search Report, International Application No. PCT/JP2019/023867, dated Aug. 13, 2019.
(Continued)

*Primary Examiner* — James M Hannett
(74) *Attorney, Agent, or Firm* — Michael Best & Friedrich LLP

(57) ABSTRACT

Exposure with sufficient optical energy is enabled while avoiding temperature rise of laser light emitting elements. Therefore, a light source device includes the plurality of laser light emitting elements and a drive unit. The drive unit drives each of the laser light emitting elements to perform a plurality of light emissions in one frame period in an image sensor that receives and captures light emitted from the plurality of laser light emitting elements and reflected by a subject.

14 Claims, 31 Drawing Sheets

(51) Int. Cl.
*G01S 7/497* (2006.01)
*H01S 5/024* (2006.01)

(56) References Cited

U.S. PATENT DOCUMENTS

| | | | |
|---|---|---|---|
| 2015/0222798 A1 | 8/2015 | Fuchikami | |
| 2017/0131088 A1 | 5/2017 | Masuda et al. | |
| 2017/0142393 A1* | 5/2017 | Oggier | H04N 13/128 |
| 2017/0364157 A1* | 12/2017 | Chung | G06F 3/016 |
| 2019/0004149 A1 | 1/2019 | Mano et al. | |

FOREIGN PATENT DOCUMENTS

| | | |
|---|---|---|
| JP | 09-306804 A | 11/1997 |
| JP | 2000-162496 A | 6/2000 |
| JP | 2015-108611 A | 6/2015 |
| JP | 2017-517737 A | 6/2017 |
| WO | 2016/021238 A1 | 2/2016 |
| WO | 2017/110413 A1 | 6/2017 |

OTHER PUBLICATIONS

Notification of Transmittal of the International Search Report and the Written Opinion of the International Searching Authority, or the Declaration (PCT/ISA/220), International Application No. PCT/JP2019/023867, dated Aug. 27, 2019.
Extended European Search Report dated Aug. 16, 2021 for corresponding European Application No. 19844024.0.

* cited by examiner

FIG. 2
A
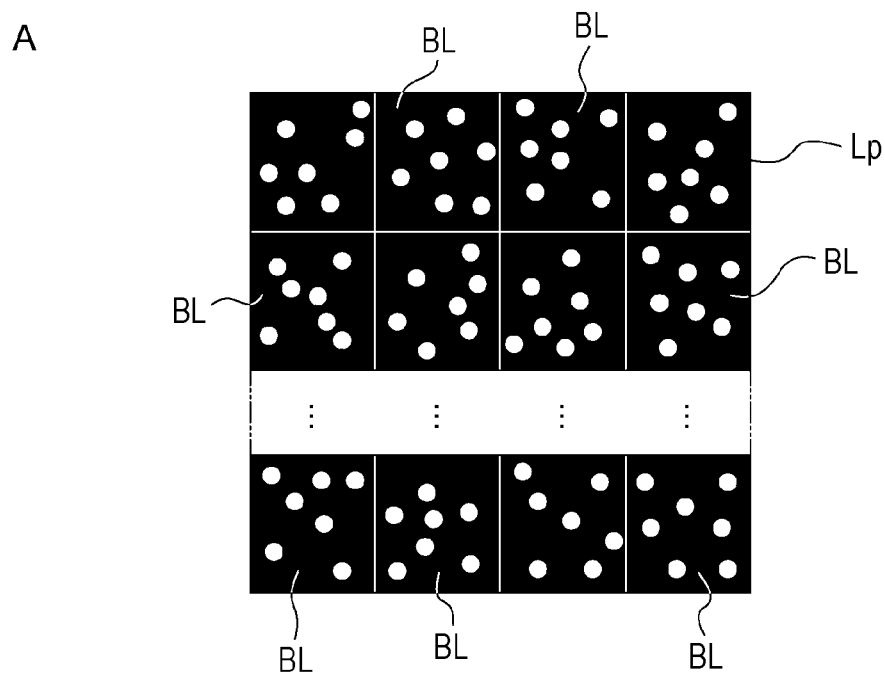
B
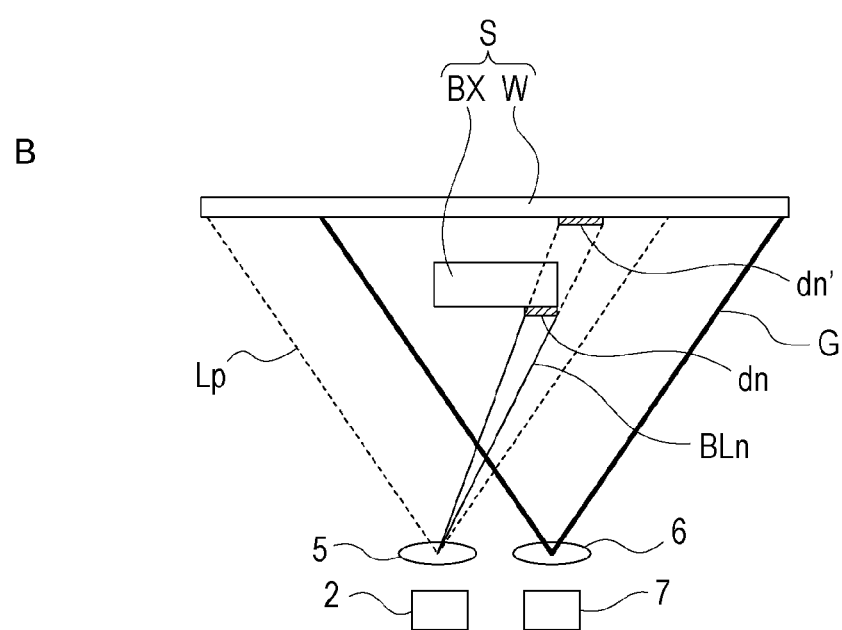

FIG. 8
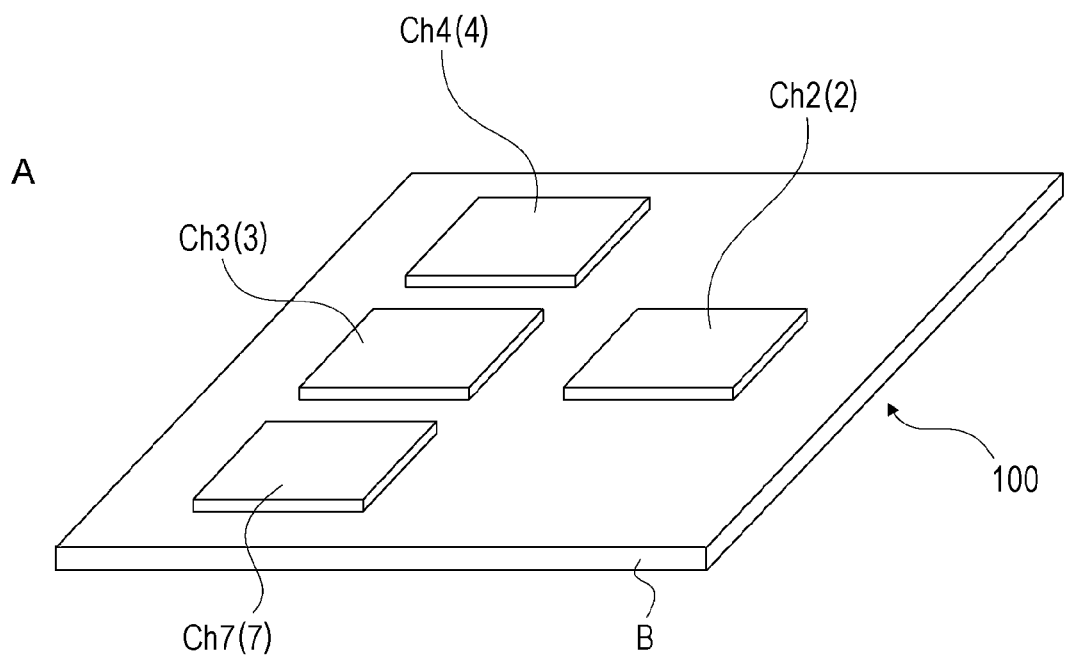
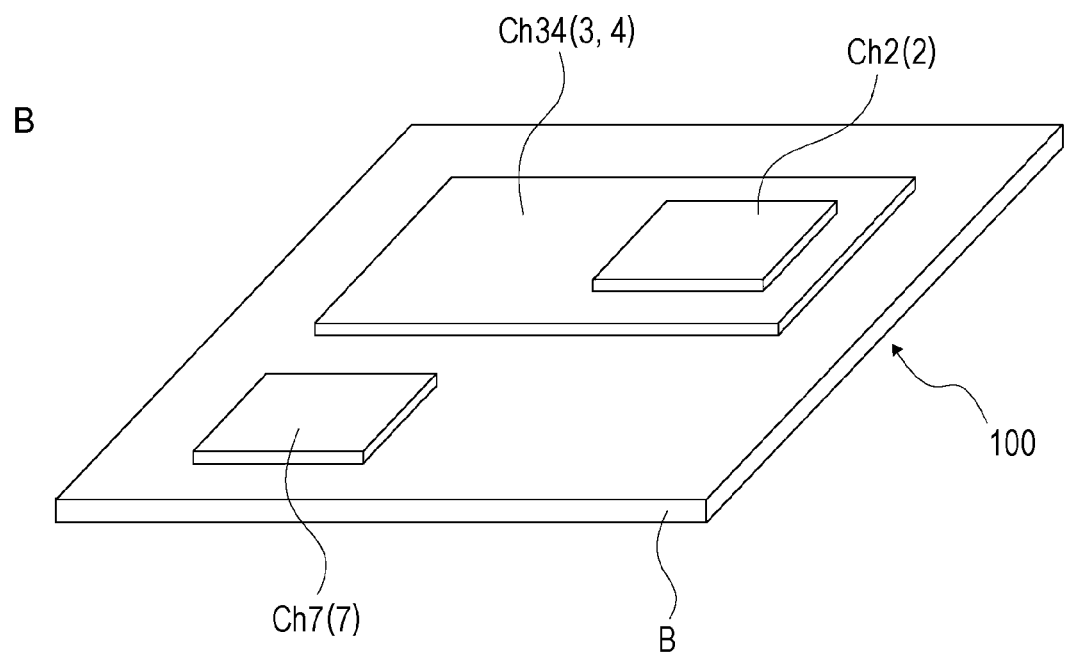

FIG. 18
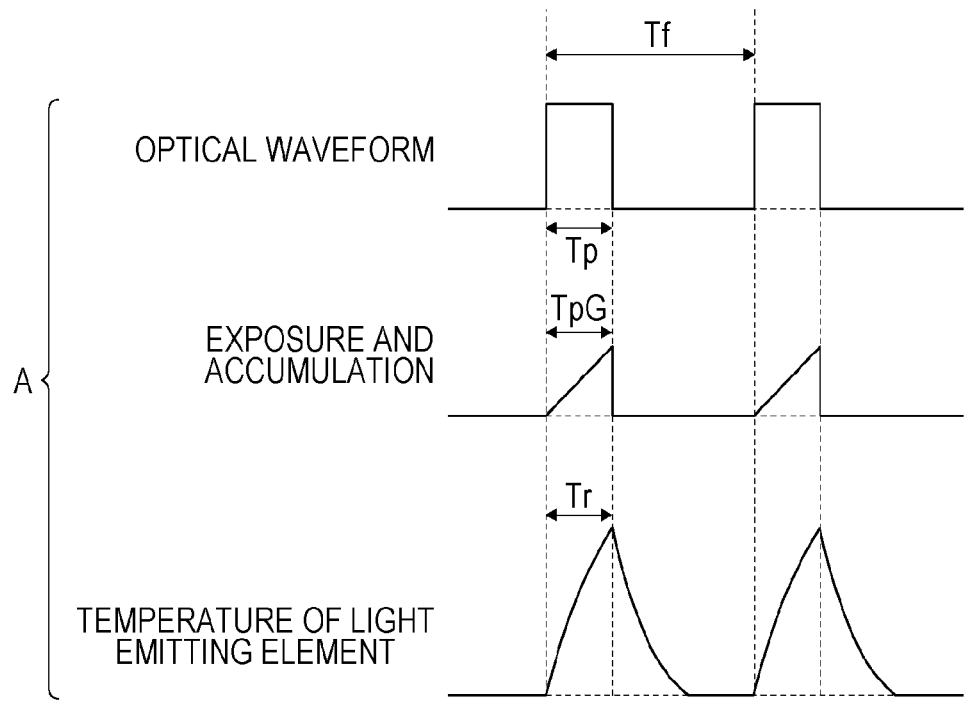
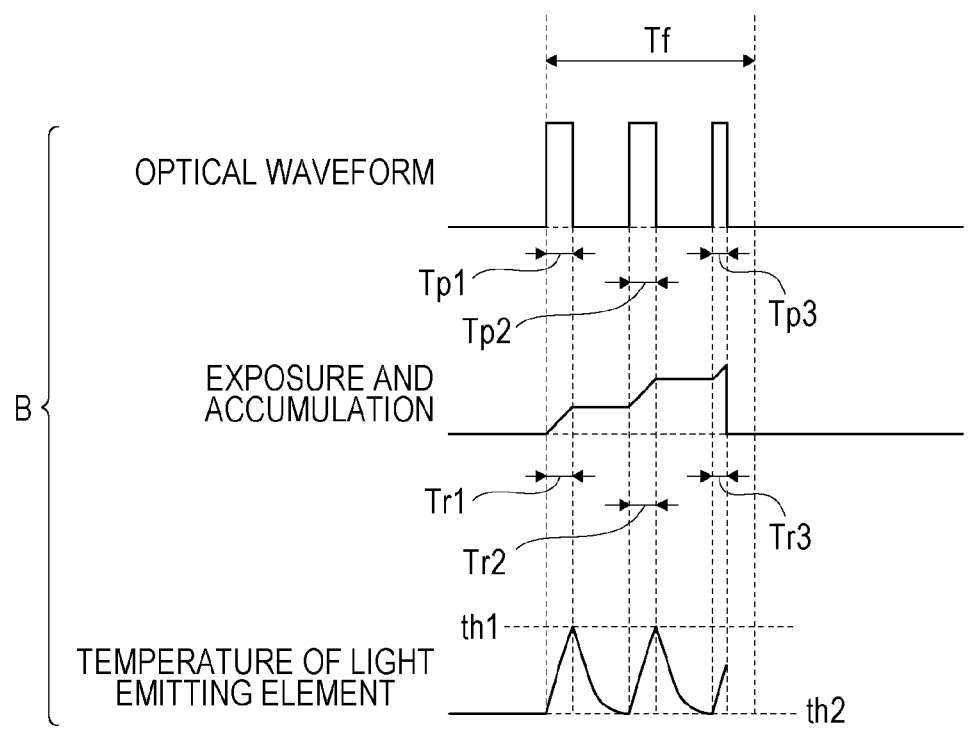

FIG. 21
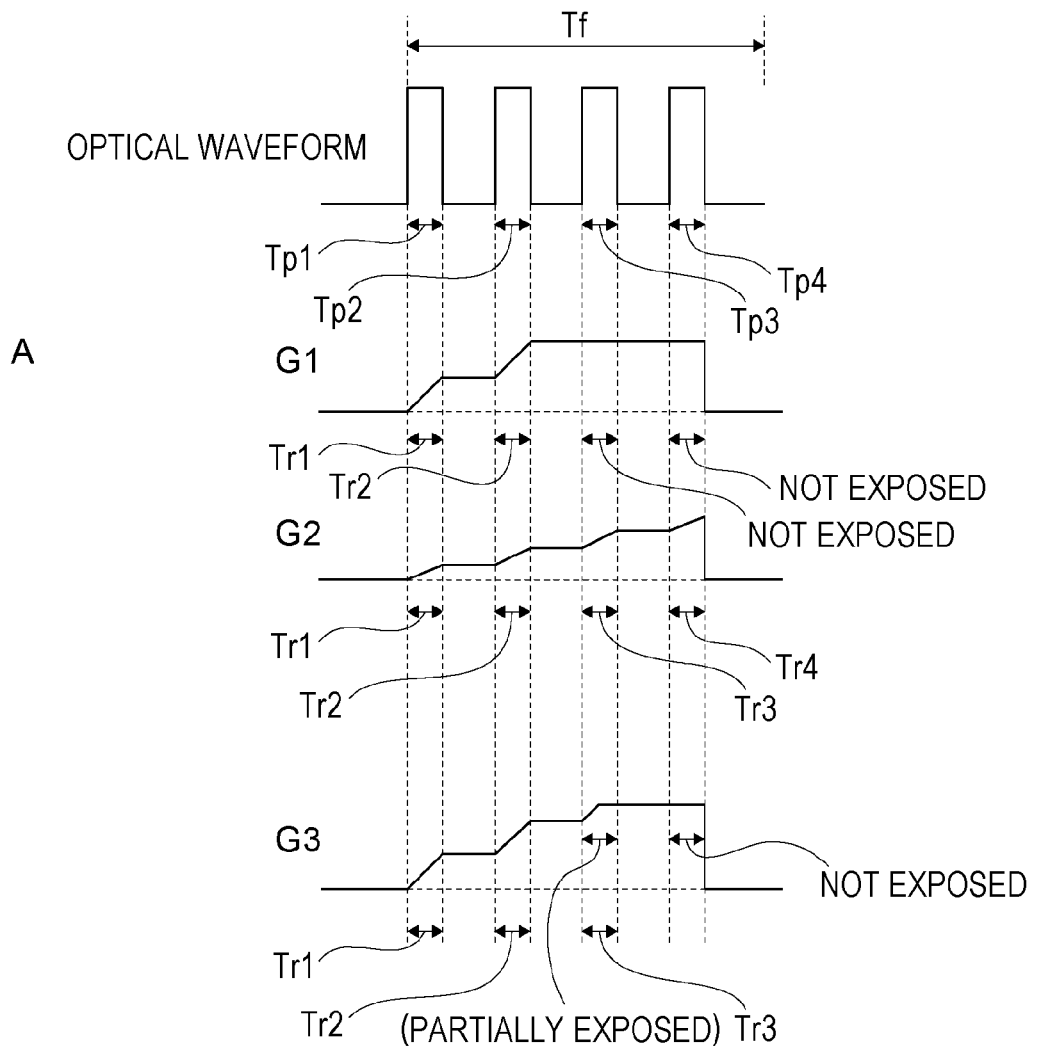
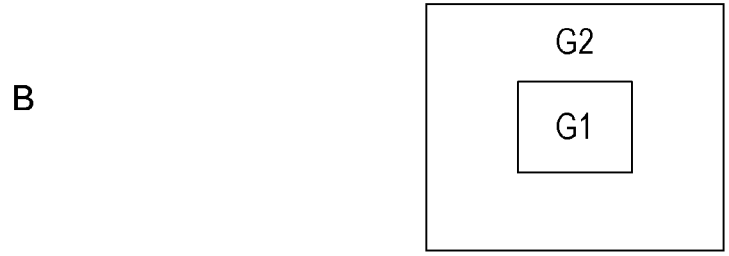

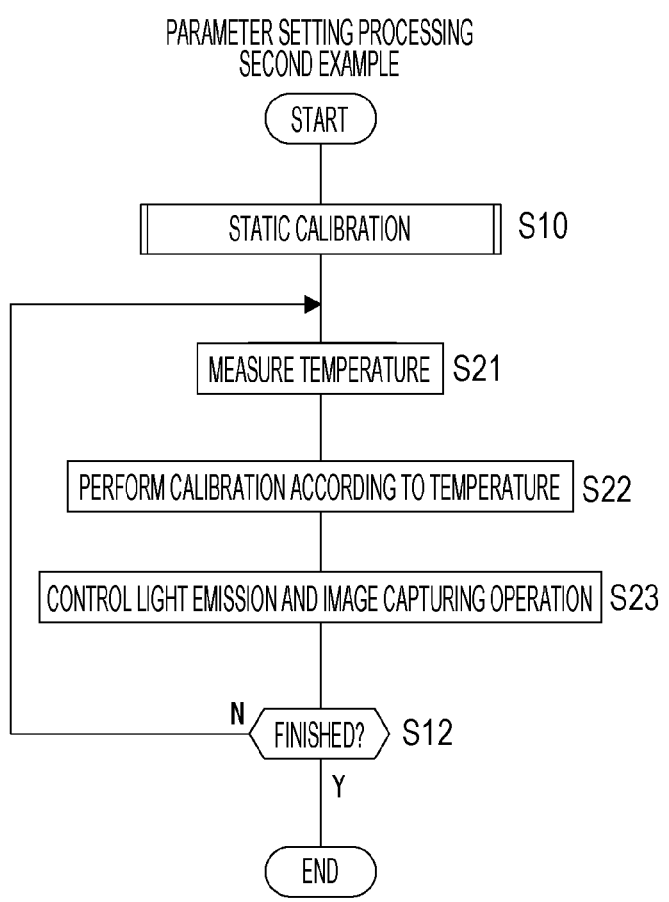

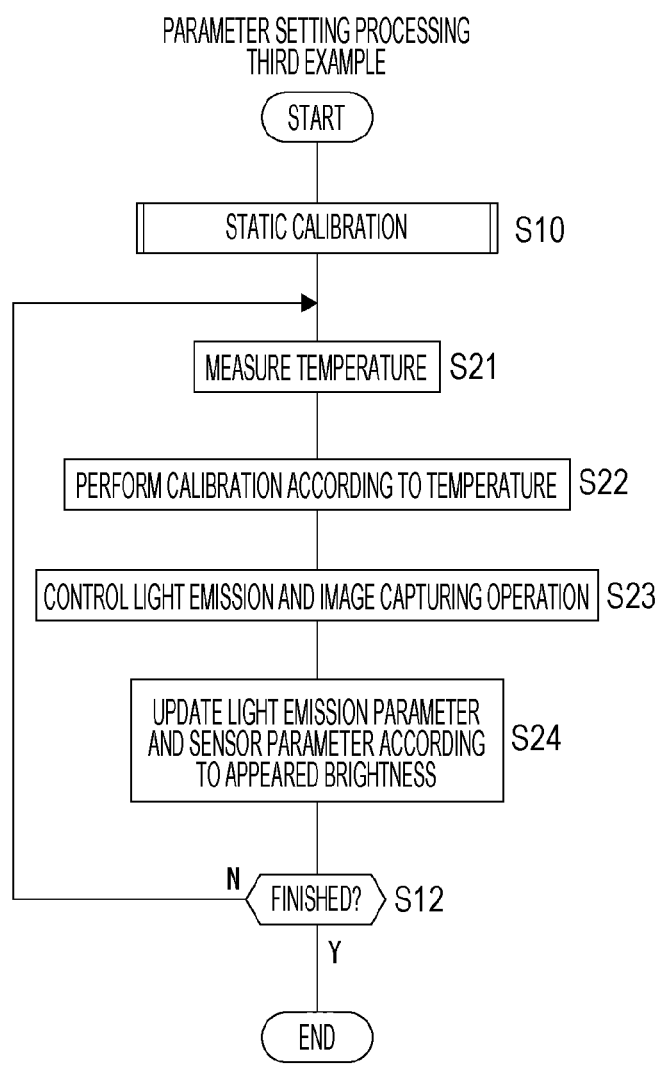

LIGHT SOURCE DEVICE, IMAGE SENSOR, AND SENSING MODULE

TECHNICAL FIELD

The present technology relates to light source devices, image sensors, and sensing modules, and particularly relates to a technical field of capturing reflected light of light emitted from a light source device with an image capturing device and sensing a distance, shape, and the like.

BACKGROUND ART

A technology of a distance measuring device is known that estimates a distance to an object and a three-dimensional (3D) shape of the object by emitting light from a light source device serving as a multi-lamp laser in which a plurality of laser light emitting elements is disposed and capturing reflected light from the detected object with an image capturing device including an image sensor.

Note that Patent Document 1 described below discloses a method of calculating a distance from a plurality of pieces of image obtained by accumulating a plurality of light emissions with a constant cycle and pulse width as a distance measuring system using time of flight.

CITATION LIST

Patent Document

Patent Document 1: Japanese Patent Application Laid-Open No. 2017-517737

SUMMARY OF THE INVENTION

Problems to be Solved by the Invention

Generally, in a distance measuring system, control is performed such that light emission time on the light source device side and exposure time on the image sensor side agree with each other.

Therefore, if long exposure time is set to increase exposure, the light source side will inevitably have longer light emission duration time.

At this time, there is a possibility that the temperature of the light source that continues light emission for a long time will rise due to heat generation, leading to a decrease in luminous efficiency and an oscillation stop due to high temperature. Therefore, the upper limit of the exposure time is determined by the heat generated on the light source side.

Therefore, sensing precision may decrease because sufficient exposure cannot be performed, accurate coordinates cannot be detected from captured data, and the like.

Therefore, a purpose of the present technology is to make it possible to inhibit the temperature rise of the light source while implementing desired exposure time.

Solutions to Problems

A light source device according to the present technology includes: a plurality of laser light emitting elements; and a drive unit configured to drive each of the laser light emitting elements to perform a plurality of light emissions in one frame period in an image sensor that receives and captures light emitted from the plurality of laser light emitting elements and reflected by a subject.

For example, it is assumed that distance measurement, object recognition, and the like are performed by causing the light emitted from the plurality of laser light emitting elements of the light source device to be reflected by the subject and receiving and capturing the reflected light by the image sensor. In such a case, if the laser emits light continuously, temperature rise increases. Meanwhile, in some cases, it is may be desired to perform exposure to laser light for a long time in order to secure a luminance level on the image sensor side. Therefore, one laser light emission is divided into a plurality of laser light emissions to be performed in one frame period for obtaining one piece of image on the image sensor side.

In the light source device according to the present technology described above, it is considered that the drive unit changes the number of light emissions of the laser light emitting elements in one frame period according to a temperature detection result.

For example, during a period when the temperature rise is not detected, one light emission is performed in one frame period, and if the temperature rise is detected, a plurality of light emissions is performed in one frame period.

In the light source device according to the present technology described above, it is considered that the drive unit changes the number of light emissions of the laser light emitting elements as a plurality of light emissions in one frame period according to a temperature detection result.

For example, depending on temperature conditions, the number of emissions as the plurality of light emissions is switched, such as two light emissions or three light emissions in one frame period.

In the light source device according to the present technology described above, it is considered that the laser light emitting elements include vertical cavity surface emitting lasers.

That is, the light source device called a vertical cavity surface emitting laser (VCSEL) is assumed.

It is considered that the light source device according to the present technology described above further includes a temperature sensor configured to detect a temperature near the laser light emitting elements.

For example, the temperature sensor is disposed near the laser light emitting elements as VCSEL.

In the light source device according to the present technology described above, it is considered that a temperature sensor configured to detect a temperature near the laser light emitting elements is further provided, and the drive unit performs light emission suspension and light emission resumption of the laser light emitting elements in one frame period according to a detection result of the temperature sensor.

That is, by suspending and resuming the light emission of the laser light emitting elements according to temperature conditions, a plurality of light emissions is performed in one frame period.

In the light source device according to the present technology described above, it is considered that the drive unit drives each of the laser light emitting elements according to a light emission parameter that defines a light emission operation of the laser light emitting elements per predetermined unit.

The predetermined unit is a unit of one laser light emitting element, a unit of a blocked plurality of laser light emitting elements, and the like. The drive unit has a configuration to perform a different light emission operation for each predetermined unit.

In the light source device according to the present technology described above, it is considered that the drive unit drives each of the laser light emitting elements according to a light emission parameter that defines a light emission operation of the laser light emitting elements, and the light source device includes a control unit configured to generate the light emission parameter.

That is, in the light source device (for example, in a chip as the light source device), for example, the control unit is provided to generate the light emission parameter that sets the number of light emissions of the laser light emitting elements in one frame period according to temperature conditions.

In the light source device according to the present technology described above, it is considered that the drive unit controls duration time of one light emission of the plurality of light emissions with a set light emission parameter.

That is, the light emission period length of each of the plurality of light emissions is set with the light emission parameter.

In the light source device according to the present technology described above, it is considered that the drive unit controls a light emission interval of the plurality of light emissions with a set light emission parameter.

That is, the light emission interval (non-light emission period) in a case where each of the plurality of light emissions is performed is set with the light emission parameter.

An image sensor according to the present technology includes a photoelectric conversion unit configured, in a case where a plurality of laser light emitting elements of a light source device performs a plurality of light emissions in one frame period in which a captured image is generated, to perform exposure to light emitted from the laser light emitting elements and reflected by a subject in an exposure period corresponding to a period of each of the plurality of light emissions, and the image sensor outputs one-frame captured data obtained by a plurality of exposures.

The light emitted from the light source device is reflected by the subject, and the reflected light is received and captured by the image sensor to perform distance measurement and object recognition. At this time, on the light source device side, a plurality of light emissions is performed in one frame period of the image capturing device. Correspondingly, the image capturing device (image sensor) performs a plurality of exposures to generate one-frame captured data.

In the image sensor according to the present technology described above, it is considered that a charge holding unit is further provided to hold a charge by the exposure of the photoelectric conversion unit according to the period of each of the plurality of light emissions of the laser light emitting elements in one frame period, and a charge signal that generates one image in each frame period is read from the charge holding unit.

The charge holding unit generates the one-frame charge signal corresponding to a plurality of exposures.

In the image sensor according to the present technology described above, it is considered that the photoelectric conversion unit allows settings of an operation of performing exposure corresponding to a period of each of the plurality of light emissions in one frame, and an operation of performing exposure corresponding to a period of a part of the plurality of light emissions.

That is, the operation of performing exposure corresponding to a period of each of the plurality of light emissions of the laser light emitting elements and the operation of performing exposure in a period of a part of the plurality of light emissions can be selectively performed.

A sensing module according to the present technology includes: a plurality of laser light emitting elements; a drive unit configured to drive each of the laser light emitting elements to perform a plurality of light emissions in one frame period in an image sensor that receives and captures light emitted from the plurality of laser light emitting elements and reflected by a subject; and the image sensor including a photoelectric conversion unit configured to perform exposure to the light emitted from the laser light emitting elements and reflected by the subject in an exposure period corresponding to a period of each of the plurality of light emissions, the image sensor outputting one-frame captured data obtained by a plurality of the exposures.

For example, the sensing module that performs distance measurement and object recognition is configured.

This sensing module is a distance measuring system that estimates a 3D shape of an object by causing light emitted from a light source to be reflected by an object, capturing the reflected light with the image sensor, and performing signal processing on the basis of a capturing result. The sensing module performs a plurality of light emissions from the light source in order to obtain one-time captured image, and estimates the distance, 3D shape of the object, and the like by using one piece of captured image generated by accumulating the reflected light of the plurality of light emissions.

In the sensing module according to the present technology described above, it is considered that a temperature sensor configured to detect a temperature near the laser light emitting elements is further provided. The drive unit changes the number of light emissions of the laser light emitting elements in one frame period according to a temperature detection result by the temperature sensor.

For example, during a period when the temperature rise is not detected, one light emission is performed in one frame period, and if the temperature rise is detected, a plurality of light emissions is performed in one frame period.

Effects of the Invention

According to the present technology, by dividing the light emission into a plurality of light emissions, it is possible to inhibit the temperature rise of the light source while implementing desired exposure time, and as a result, it is possible to contribute to improvement in light emission efficiency.

Note that advantageous effects described here are not necessarily restrictive, and any of the effects described in the present disclosure may be applied.

BRIEF DESCRIPTION OF DRAWINGS

FIG. 2 is an explanatory diagram of a distance measurement method by a structured light (STL) technique.

FIG. 8 is a diagram showing still another substrate configuration example of the light source device according to the embodiment.

FIG. 18 is an explanatory diagram of an operation of a plurality of adaptive light emissions according to a temperature according to a second embodiment.

FIG. 21 is an explanatory diagram of the number of exposures different in a plane according to a third embodiment.

FIG. 31 is a flowchart of a second example of the parameter adjustment processing according to the fourth embodiment.

FIG. 32 is a flowchart of a third example of the parameter adjustment processing according to the fourth embodiment.

MODE FOR CARRYING OUT THE INVENTION

Embodiments will be described below in the following order.

<1. Overall configuration of distance measuring device>
<2. About distance measurement method>
<3. Circuit configuration related to light emission drive>
<4. Variation in substrate configuration>
<5. Structure example of VCSEL>
<6. First embodiment: Plurality of light emissions>
<7. Second embodiment: Plurality of adaptive light emissions according to temperature>
<8. Third embodiment: Number of exposures different in plane>
<9. Fourth Embodiment: Individual setting of light emission parameter>
<10. Parameter setting processing example>
<11. Conclusion and modified example>

1. Overall Configuration of Distance Measuring Device

Figure 1:
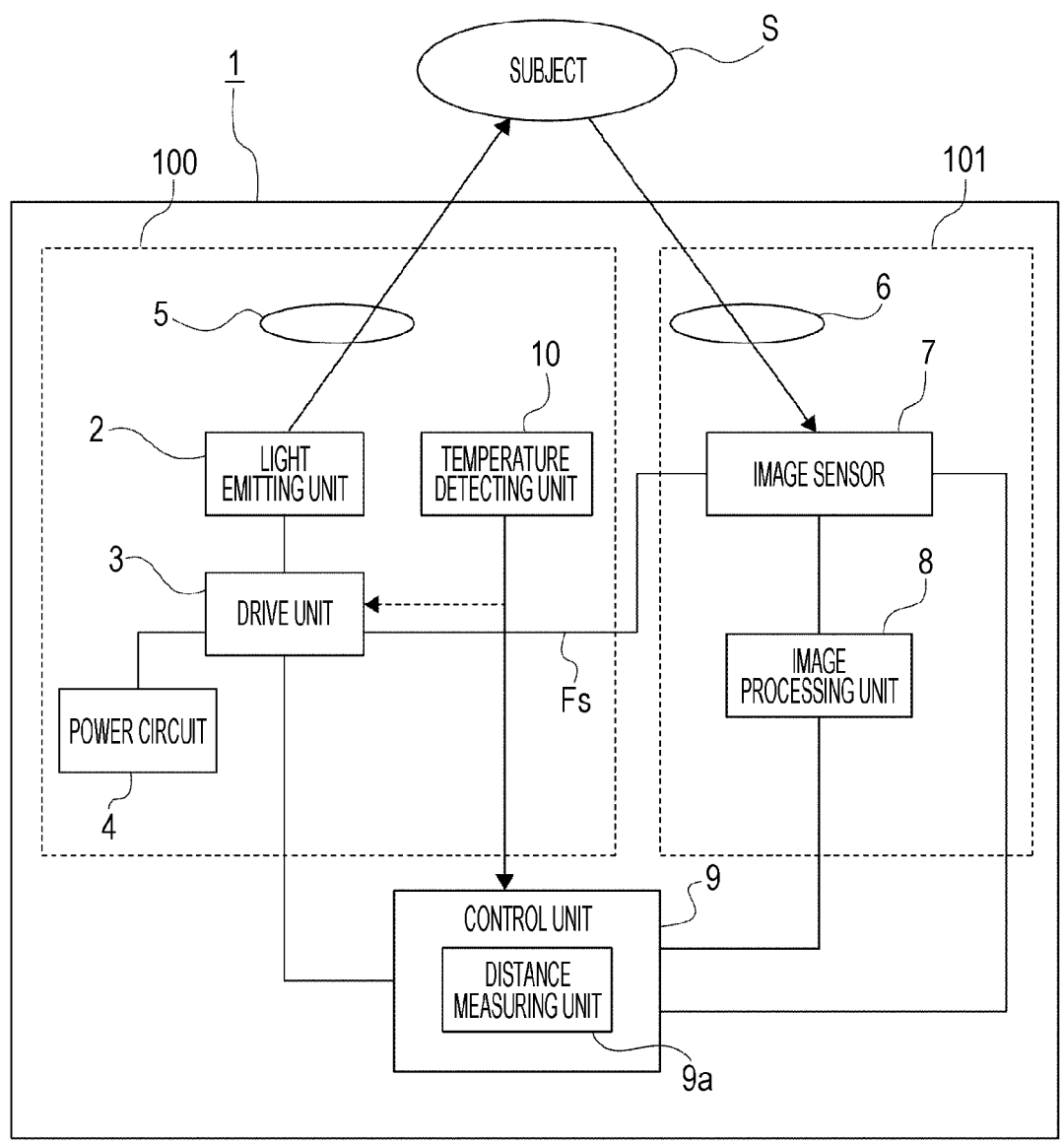
FIG. 1 is a diagram showing a configuration example of a distance measuring device according to an embodiment of the present technology.

FIG. 1 shows a configuration example of a distance measuring device 1 as embodiments according to the present technology.

Note that in this example, the distance measuring device 1 has a configuration including a light source device 100 and an image capturing device 101.

As shown in the figure, the distance measuring device 1 includes: a light emitting unit 2, a drive unit 3, a power circuit 4, a light emission side optical system 5, and a temperature detecting unit 10 as the light source device 100; and an image capturing side optical system 6, an image sensor 7, and an image processing unit 8 as the image capturing device 101. Furthermore, the distance measuring device 1 includes a control unit 9.

The control unit 9 may be included in the light source device 100, may be included in the image capturing device 101, or may be configured separately from the light source device 100 or the image capturing device 101.

The light emitting unit 2 emits light from a plurality of light sources. As described later, the light emitting unit 2 of this example includes laser light emitting elements 2a by VCSEL as each light source (hereinafter, also simply referred to as "light emitting elements 2a"). The light emitting elements 2a are arranged, for example, in a predetermined manner such as a matrix.

The drive unit 3 includes an electric circuit for driving the light emitting unit 2.

The power circuit 4 generates a power voltage for the drive unit 3 (drive voltage Vd as described later), for example, on the basis of an input voltage from a battery and the like (not shown) provided in the distance measuring device 1 (input voltage Vin as described later). The drive unit 3 drives the light emitting unit 2 on the basis of the power voltage.

The light emitted from the light emitting unit 2 is emitted to a subject S as a distance measuring target via the light emission side optical system 5. Then, the reflected light of the thus emitted light from the subject S enters an image capturing surface of the image sensor 7 via the image capturing side optical system 6.

The image sensor 7 is, for example, an image capturing element such as a charge coupled device (CCD) sensor or a complementary metal oxide semiconductor (CMOS) sensor, and receives the reflected light that enters from the subject S via the image capturing side optical system 6 as described above, converts the reflected light into an electric signal and outputs the electric signal.

The image sensor 7 performs, for example, correlated double sampling (CDS) processing, automatic gain control (AGC) processing, and the like on the electric signal obtained by photoelectrically converting the received light, and further performs analog/digital (A/D) conversion processing. Then, the image sensor 7 outputs an image signal as digital data to the image processing unit 8 in the subsequent stage.

Furthermore, the image sensor 7 of this example outputs a frame synchronization signal Fs to the drive unit 3. This allows the drive unit 3 to cause the light emitting elements 2a in the light emitting unit 2 to emit light at timing according to a frame cycle of the image sensor 7.

The image processing unit 8 is configured as an image processing processor by, for example, a digital signal processor (DSP) and the like. The image processing unit 8 performs various types of image signal processing on a digital signal (image signal) input from the image sensor 7.

The control unit 9 includes, for example, a microcomputer having a central processing unit (CPU), a read only memory (ROM), a random access memory (RAM), and the like or an information processing device such as a DSP. The control unit 9 controls the drive unit 3 for controlling a light emission operation by the light emitting unit 2, and controls the image capturing operation by the image sensor 7.

The control unit 9 has a function as a distance measuring unit 9a. The distance measuring unit 9a measures a distance to the subject S on the basis of the image signal input via the image processing unit 8 (that is, image signal obtained by receiving the reflected light from the subject S). The distance measuring unit 9a of this example measures the distance to each part of the subject S in order to enable identification of a three-dimensional shape of the subject S.

Here, a specific distance measuring method in the distance measuring device 1 will be described later again.

Furthermore, the control unit 9 may be configured to control the power circuit 4.

The temperature detecting unit 10 detects a temperature of the light emitting unit 2. The temperature detecting unit 10 can have a configuration to detect the temperature by using, for example, a diode.

A detection signal by the temperature detecting unit 10 is detected by the control unit 53 and necessary control is performed. However, as shown by the broken line, a configuration is also considered in which the drive unit 3 detects the detection signal by the temperature detecting unit 10 and the drive unit 3 changes the drive of the light emitting elements 2a of the light emitting unit 2.

Note that the configuration of the temperature detecting unit 10 and specific processing performed by the control unit 9 according to a temperature detection result by the temperature detecting unit 10 will be described later.

2. About Distance Measurement Method

As the distance measurement method in the distance measuring device 1, for example, distance measurement methods using the structured light (STL) technique or time of flight (ToF) technique can be adopted.

The STL technique is, for example, a technique for measuring a distance on the basis of an image obtained by capturing an image of the subject S on which light having a predetermined light/dark pattern such as a dot pattern or a grid pattern is emitted.

FIG. 2 is an explanatory diagram of the STL technique.

In the STL technique, for example, pattern light Lp having a dot pattern as shown in FIG. 2A is emitted on the subject S. The pattern light Lp is divided into a plurality of blocks BL, and different dot patterns are assigned to respective blocks BL (dot patterns are not duplicated between blocks B).

FIG. 2B is an explanatory diagram of the distance measurement principle of the STL technique.

In the example here, a wall W and a box BX disposed in front of the wall W are the subject S, and the pattern light Lp is emitted to the subject S. "G" in the figure schematically represents the angle of view of the image sensor 7.

Furthermore, "BLn" in the figure means light of a certain block BL in the pattern light Lp, and "dn" means the dot pattern of the block BLn that appears on the image captured by the image sensor 7.

Here, in a case where the box BX in front of the wall W does not exist, the dot pattern of the block BLn appears at the position of "dn'" in the figure in the captured image. That is, the position where the pattern of the block BLn appears in the captured image differs between in a case where the box BX exists and in a case where the box BX does not exist. Specifically, pattern distortion occurs.

The STL technique is a technique to obtain the shape and depth of the subject S by using the fact that the pattern emitted in this way is distorted by the object shape of the subject S. Specifically, this is a technique to obtain the shape and depth of the subject S from the distortion of the pattern.

In a case where the STL technique is adopted, for example, an infrared (IR) image sensor by the global shutter technique is used as the image sensor 7. Then, in a case where the STL technique is used, the distance measuring unit 9a controls the drive unit 3 such that the light emitting unit 2 emits the pattern light, and detects the pattern distortion in the image signal obtained via the image processing unit 8 and calculates the distance on the basis of how the pattern is distorted.

Subsequently, the ToF technique is a technique to measure the distance to the object by detecting the time of flight (time difference) of the light emitted from the light emitting unit 2 until the light is reflected by the object and reaches the image sensor 7.

In a case where the so-called direct ToF technique is adopted as the ToF technique, a single photon avalanche diode (SPAD) is used as the image sensor 7, and the light emitting unit 2 is pulse-driven. In this case, on the basis of the image signal input via the image processing unit 8, the distance measuring unit 9a calculates the time difference from light emission to light reception of the light emitted from the light emitting unit 2 and received by the image sensor 7, and calculates the distance to each part of the subject S on the basis of the time difference and the speed of light.

Note that in a case where the so-called indirect ToF technique (phase difference method) is adopted as the ToF technique, for example, an IR image sensor is used as the image sensor 7.

3. Circuit Configuration Related to Light Emission Drive

Figure 3:
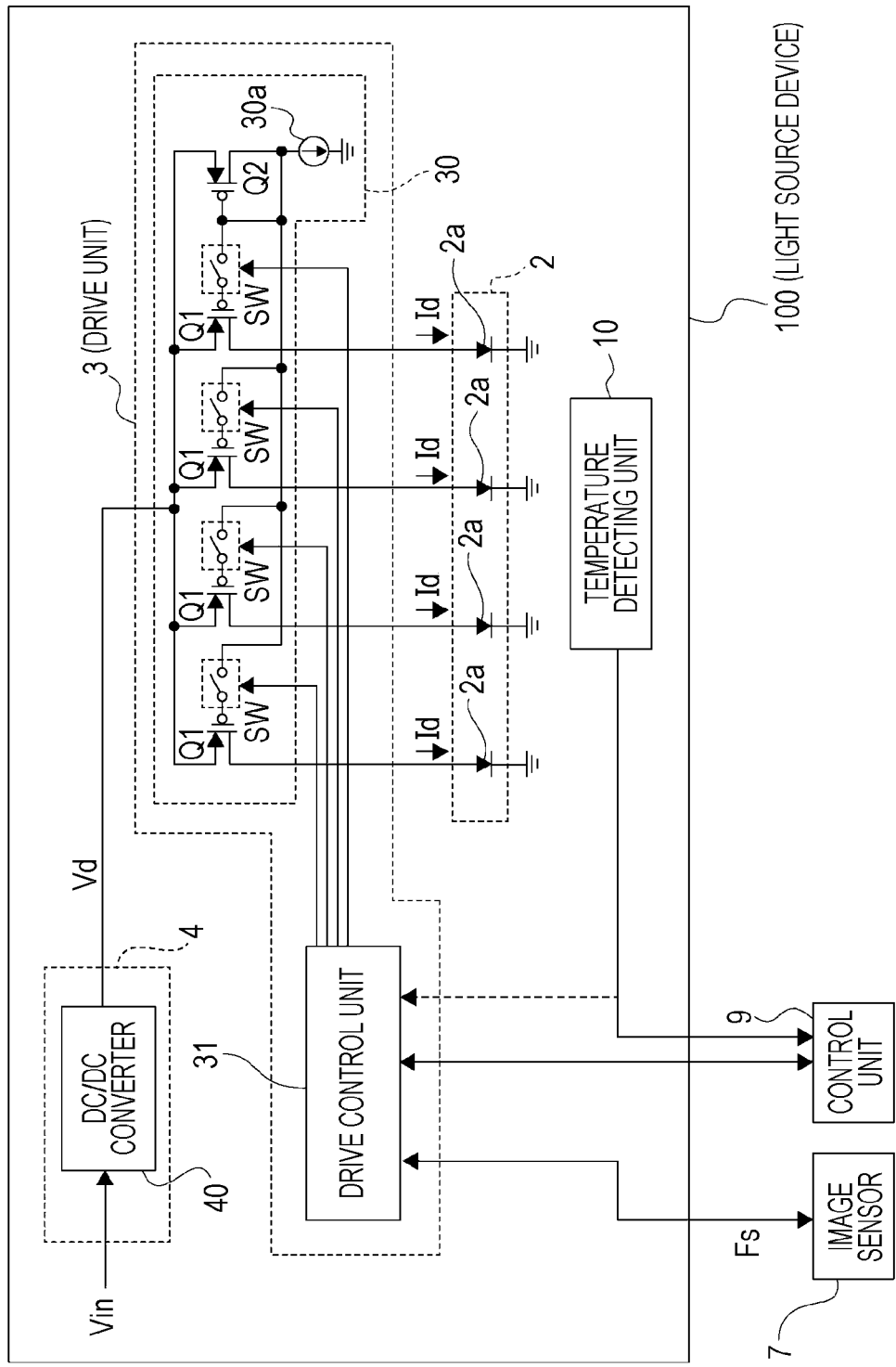
FIG. 3 is a diagram showing a circuit configuration example of a light source device according to the embodiment.

FIG. 3 shows a circuit configuration example of the light source device 100 including the light emitting unit 2, the drive unit 3, and the power circuit 4 shown in FIG. 1. Note that FIG. 3 shows the image sensor 7 and the control unit 9 shown in FIG. 1 together with the circuit configuration example of the light source device 100.

In this example, the light emitting unit 2, the drive unit 3, and the power circuit 4 are formed on a common substrate (substrate B as described later). Here, a configuration unit including at least the light emitting unit 2 and formed on a substrate common to the light emitting unit 2 is referred to as the light source device 100.

As shown in the figure, the light source device 100 includes the temperature detecting unit 10 together with the light emitting unit 2, the drive unit 3, and the power circuit 4.

The light emitting unit 2 includes the plurality of light emitting elements 2a as VCSEL as described above. In FIG. 3, the number of light emitting elements 2a is set at "4" for convenience of illustration, but the number of light emitting elements 2a in the light emitting unit 2 is not limited to 4, and is only required to be at least 2 or more.

The power circuit 4 includes a DC/DC converter 40, and generates a drive voltage Vd (DC voltage) to be used by the drive unit 3 to drive the light emitting unit 2 on the basis of the input voltage Vin of a DC voltage.

The drive unit 3 includes a drive circuit 30 and a drive control unit 31.

The drive circuit 30 includes a switching element Q1 and a switch SW for each light emitting element 2a, and also includes a switching element Q2 and a constant current source 30a.

Field-effect transistors (FETs) are used for the switching element Q1 and the switching element Q2, and in this example, P-channel metal-oxide-semiconductor (MOS) FETs are used.

Each switching element Q1 is connected in parallel to an output line of the DC/DC converter 40, that is, to a supply line of the drive voltage Vd. The switching element Q2 is connected in parallel to the switching elements Q1.

Specifically, sources of each switching element Q1 and the switching element Q2 are connected to the output line of the DC/DC converter 40. A drain of each switching element Q1 is connected to an anode of one corresponding light emitting element 2a of the light emitting elements 2a in the light emitting unit 2.

As shown in the figure, a cathode of each light emitting element 2a is connected to the ground (GND).

A drain of the switching element Q2 is connected to the ground via the constant current source 30a, and a gate is connected to a connection point of the drain and the constant current source 30a.

A gate of each switching element Q1 is connected to a gate of the switching element Q2 via one corresponding switch SW.

In the drive circuit 30 having the configuration described above, the switching element Q1 with the switch SW turned on conducts. The drive voltage Vd is applied to the light emitting element 2a connected to the conductive switching element Q1, and the light emitting element 2a emits light.

At this time, a drive current Id flows through the light emitting element 2a. In the drive circuit 30 having the configuration described above, the switching element Q1 and the switching element Q2 form a current mirror circuit.

A current value of the drive current Id is set at a value corresponding to a current value of the constant current source 30a.

The drive control unit 31 controls ON/OFF of the light emitting elements 2a by controlling ON/OFF of the switches SW in the drive circuit 30.

The drive control unit 31 determines ON/OFF control timing of the light emitting elements 2a, laser power (current value of the drive current Id), and the like on the basis of an instruction from the control unit 9. For example, the drive control unit 31 receives a value designating these as a light emission parameter from the control unit 9, and controls the drive of the light emitting elements 2a accordingly.

Furthermore, the frame synchronization signal Fs is supplied from the image sensor 7 to the drive control unit 31, thereby making it possible for the drive control unit 31 to synchronize ON timing and OFF timing of the light emitting elements 2a with a frame cycle of the image sensor 7.

Note that the drive control unit 31 may have a configuration to transmit the frame synchronization signal Fs and a signal indicating exposure timing to the image sensor 7.

Moreover, the control unit 9 may have a configuration to transmit a signal indicating timing of frame synchronization signal Fs emission and exposure to the drive control unit 31 and the image sensor 7.

Figure 4:
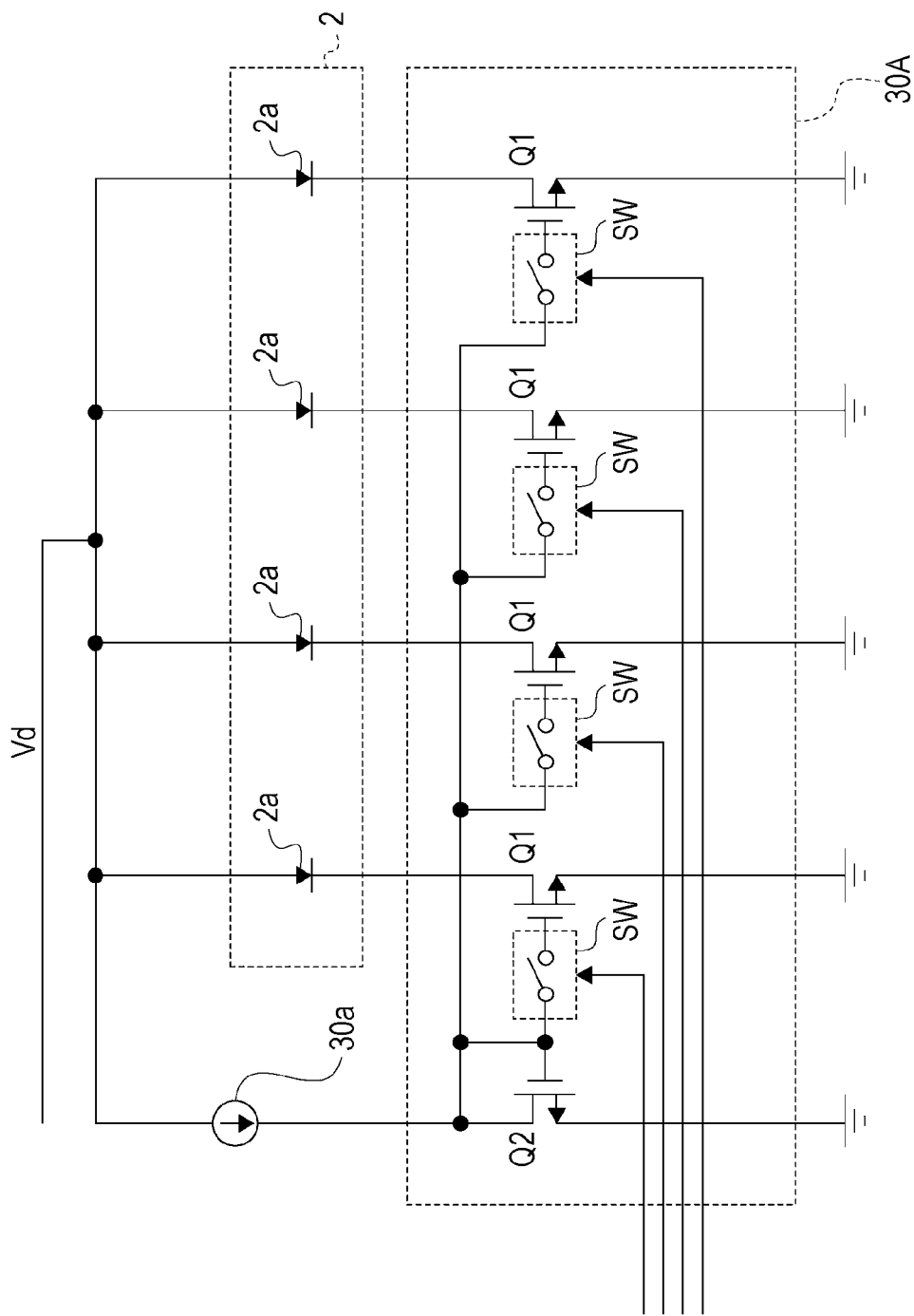
FIG. 4 is a diagram showing a modified example of a drive circuit included in the light source device according to the embodiment.

Here, FIG. 3 illustrates a configuration in which the switching elements Q1 are provided on the anode side of the light emitting elements 2a, but as in a drive circuit 30A shown in FIG. 4, it is possible to have a configuration in which the switching elements Q1 are provided on the cathode side of the light emitting elements 2a.

In this case, the anode of each light emitting element 2a in the light emitting unit 2 is connected to the output line of the DC/DC converter 40.

An N-channel MOSFET is used for the switching element Q1 and the switching element Q2 that constitute the current mirror circuit. The drain and gate of the switching element Q2 are connected to the output line of the DC/DC converter 40 via the constant current source 30a, and the source is connected to the ground via the constant current source 30a.

The drain of each switching element Q1 is connected to the cathode of the corresponding light emitting element 2a, and the source is connected to the ground. The gate of each switching element Q1 is connected to the gate and drain of the switching element Q2 via the corresponding switch SW.

In this case as well, the drive control unit 31 can turn ON/OFF the light emitting element 2a by controlling the ON/OFF of the switch SW.

Figure 5:
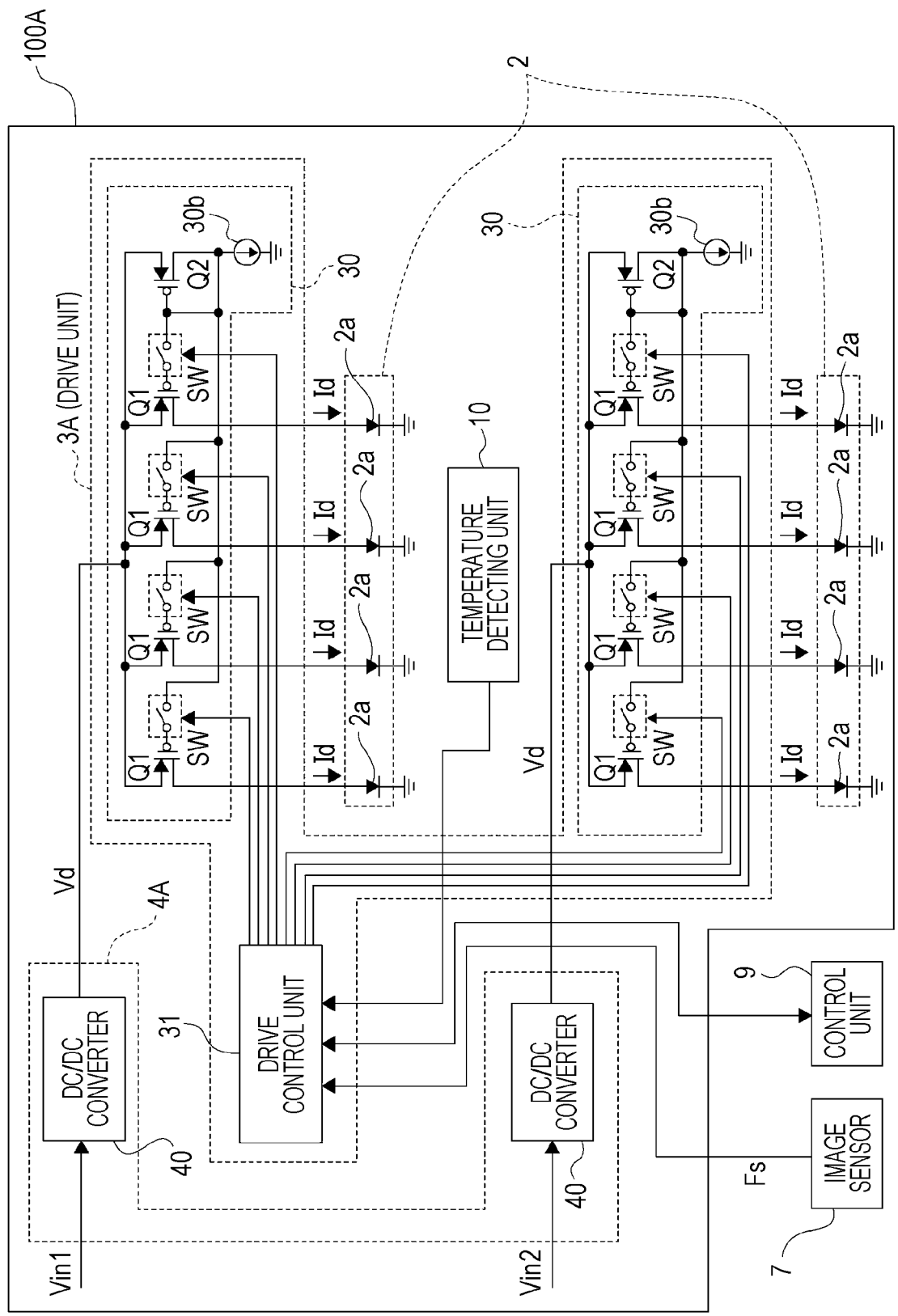
FIG. 5 is a diagram showing a circuit configuration as a modified example of the light source device according to the embodiment.

FIG. 5 shows a configuration example of a light source device 100A as a modified example.

The light source device 100A is provided with a power circuit 4A in place of the power circuit 4, and is provided with a drive unit 3A in place of the drive unit 3.

The power circuit 4A includes a plurality of the DC/DC converters 40 (two in the example of the figure). An input voltage Vin1 is supplied to one DC/DC converter 40, and an input voltage Vin2 is supplied to the other DC/DC converter 40. The drive unit 3A includes a plurality of drive circuits 30 each inputting the drive voltage Vd from the different DC/DC converter 40. As shown in the figure, each drive circuit 30 is provided with a variable current source 30b in place of the constant current source 30a. The variable current source 30b is a current source having a variable current value.

In this case, the light emitting elements 2a in the light emitting unit 2 are divided into a plurality of light emitting element groups that undergo ON/OFF control by the different drive circuits 30.

In this case, the drive control unit 31 controls ON/OFF of the switches SW in each drive circuit 30.

As in the light source device 100A, with a configuration in which at least a pair of DC/DC converters 40 and drive circuits 30 is divided into a plurality of systems, it is possible to set the drive current Id of the light emitting elements 2a at different values for each system. For example, by making the voltage value of the drive voltage Vd and the current value of the variable current source 30b different for each system, it is possible to make the value of the drive current Id different for each system. Furthermore, if the DC/DC converter 40 has a configuration to perform constant current control on the drive current Id, by making target values for the constant current control different between the DC/DC converters 40, it is also possible to make the value of the drive current Id different for each system.

In a case where the configuration as in FIG. 5 is adopted, it is considered to make the values of the drive voltage Vd and the drive current Id different for each system according to the light emission intensity distribution, the temperature distribution, and the like in the light emitting unit 2. For example, it is considered to increase the drive current Id and increase the drive voltage Vd for a system corresponding to a location where the temperature is high in the light emitting unit 2, and the like.

4. Variation in Substrate Configuration

Figure 6:
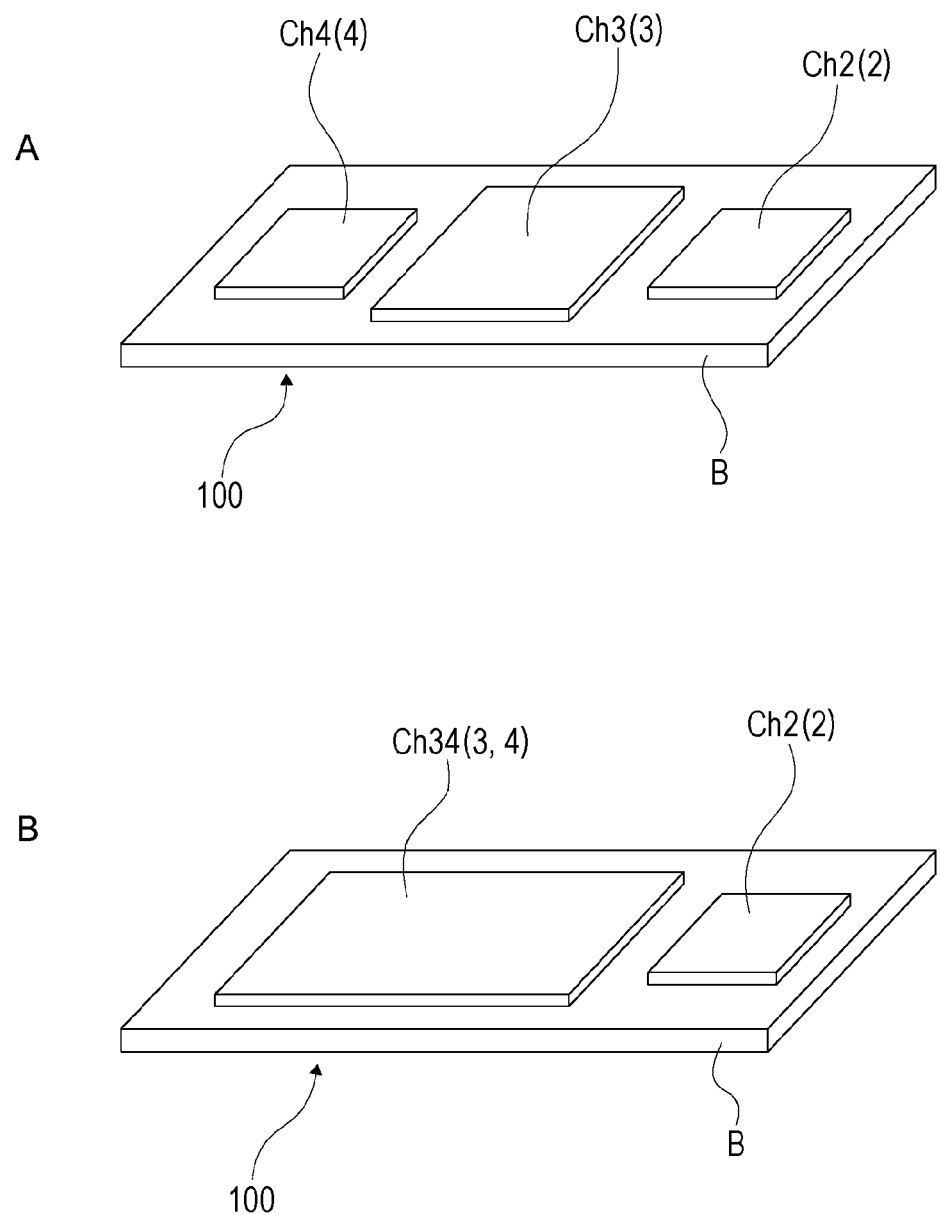
FIG. 6 is a diagram showing a substrate configuration example of the light source device according to the embodiment.
Figure 7:
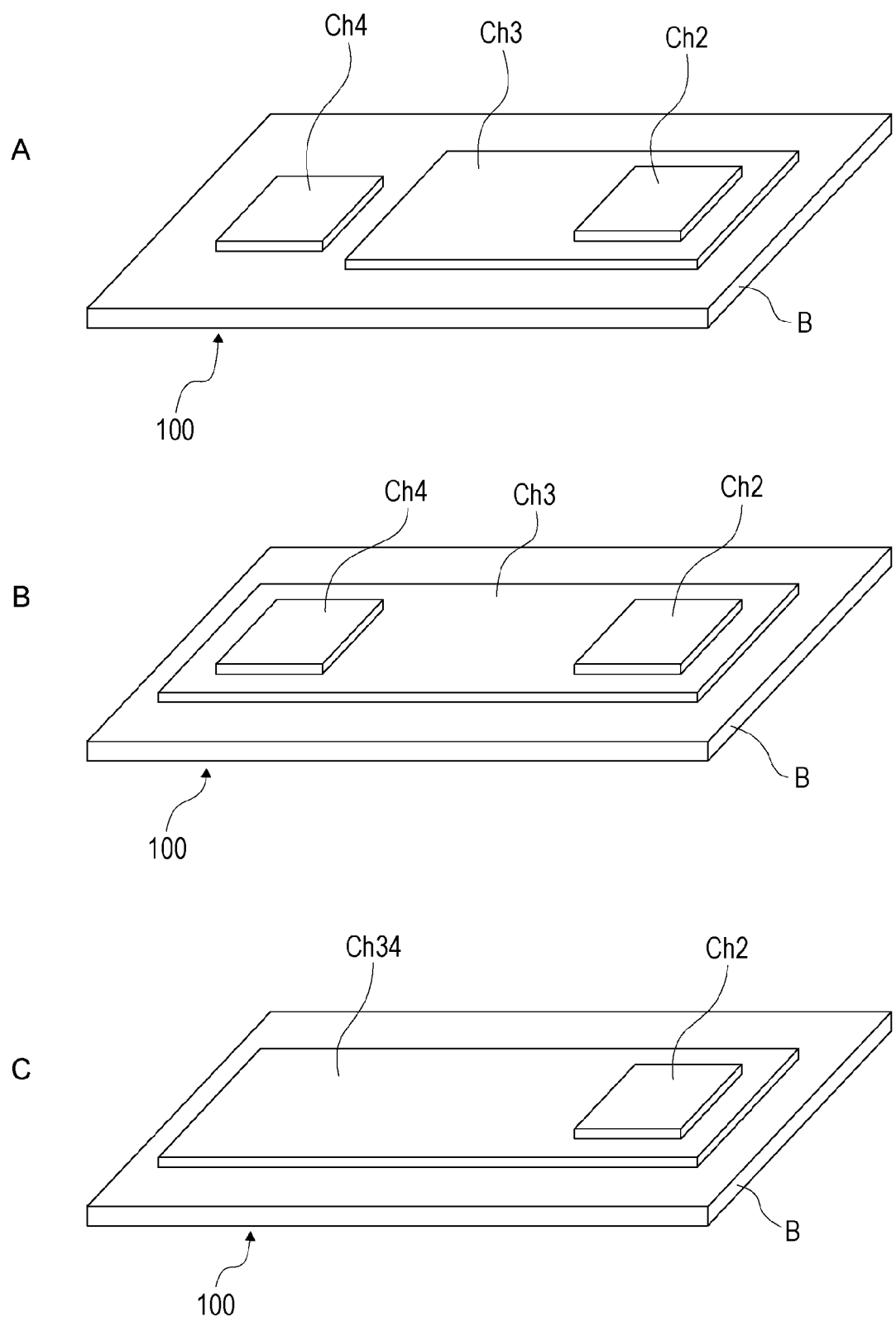
FIG. 7 is a diagram showing another substrate configuration example of the light source device according to the embodiment.

Here, the light source device 100 can have configurations shown in FIGS. 6 to 8.

The light source device 100 can have the configuration shown in FIG. 6A in which a chip Ch2 in which a circuit as the light emitting unit 2 is formed, a chip Ch3 in which a circuit as the drive unit 3 is formed, and a chip Ch4 in which the power circuit 4 is formed are formed on the same substrate B.

Furthermore, the drive unit 3 and the power circuit 4 can be formed on the same chip Ch34, and in this case, the light source device 100 can have a configuration in which the chip Ch2 and the chip Ch34 are formed on the same substrate B as shown in FIG. 6B.

Furthermore, the light source device 100 can have a configuration in which another chip Ch is mounted on a chip Ch.

In this case, the light source device 100 can have, for example, the configuration as in FIG. 7A in which the chip Ch3 on which the chip Ch2 is mounted and the chip Ch4 are formed on the substrate B, the configuration as in FIG. 7B in which the chip Ch3 on which the chip Ch2 and the chip Ch4 are mounted is formed on the substrate B, or the configuration as in FIG. 7C in which the chip Ch34 on which the chip Ch2 is mounted is formed on the substrate B.

Furthermore, the light source device 100 can include the image sensor 7.

For example, FIG. 8A illustrates a configuration of the light source device 100 in which, along with the chip Ch2, the chip Ch3, and the chip Ch4, a chip Ch7 in which a circuit as the image sensor 7 is formed is formed on the same substrate B.

Furthermore, FIG. 8B illustrates a configuration of the light source device 100 in which the chip Ch34 on which the chip Ch2 is mounted and the chip Ch7 are formed on the same substrate B.

Note that the light source device 100A described above can also adopt a configuration similar to the configuration described in FIGS. 6 to 8.

Here, about the temperature detecting unit 10, for example, in a case where the chip Ch2 is formed on the substrate B as in FIGS. 6A, 6B, and 8A, a temperature detecting element such as a diode is only required to be formed at a position near the chip Ch2 on the substrate B (for example, lateral position of the chip Ch2 on the substrate B, and the like).

Furthermore, in the configuration where the chip Ch2 is mounted on another chip Ch such as in FIGS. 7A to 7C and 8B, the temperature detecting element is only required to be formed at a position near the chip Ch2 on the other chip Ch (for example, position directly below the chip Ch2, and the like).

The temperature detecting unit 10 may include a plurality of temperature sensors 10a each having a temperature detecting element such as a diode.

Figure 9:
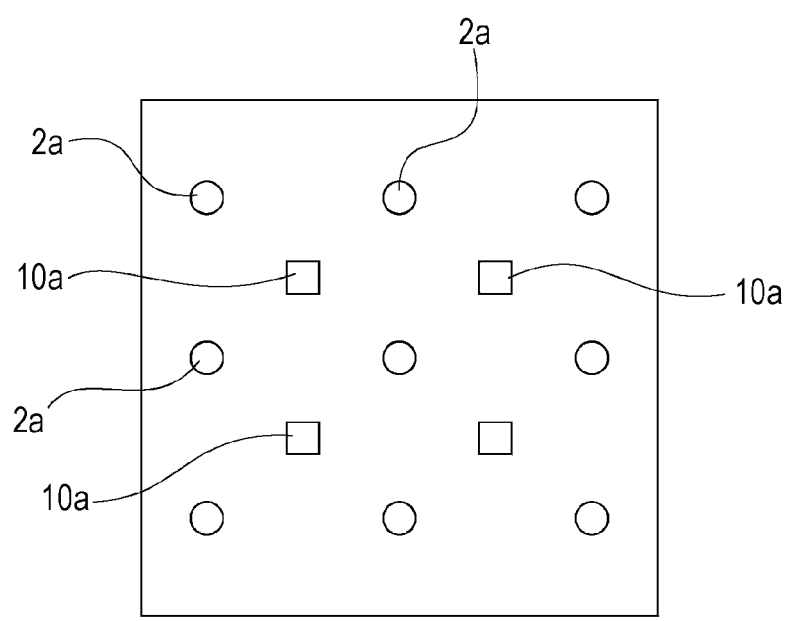
FIG. 9 is a diagram showing an arrangement example of temperature sensors included in the light source device according to the embodiment.

FIG. 9 shows an arrangement example of each temperature sensor 10a in a case where the temperature detecting unit 10 includes the plurality of temperature sensors 10a.

In this example of FIG. 9, the plurality of temperature sensors 10a is not positioned exclusively in one place, but is arranged discretely in a plane parallel to a plane on which the light emitting elements 2a are arranged. Specifically, the plurality of temperature sensors 10a can be arranged, for example, on a one-by-one basis in each light emitting block including a predetermined number of light emitting elements 2a such as vertically 2× horizontally 2=4. At this time, respective temperature sensors 10a can also be arranged at equal intervals in the plane parallel to the plane on which the light emitting elements 2a are arranged.

Note that FIG. 9 shows an example in which four temperature sensors 10a are arranged for nine light emitting elements 2a, but the number of arranged light emitting elements 2a and temperature sensors 10a is not limited to this example.

By arranging the plurality of temperature sensors 10a discretely as in the example of FIG. 9, it is possible to detect in-plane temperature distribution of the light emitting unit 2. Furthermore, it is possible to detect and classify the temperature of each area on a light emitting surface, and moreover, it is also possible to detect and classify the temperature of each light emitting element 2a by increasing the number of arranged temperature sensors 10a.

5. Structure Example of VCSEL

Subsequently, a structure example of the chip Ch2 in which the light emitting unit 2 is formed will be described with reference to FIGS. 10 and 11.

Figure 10:
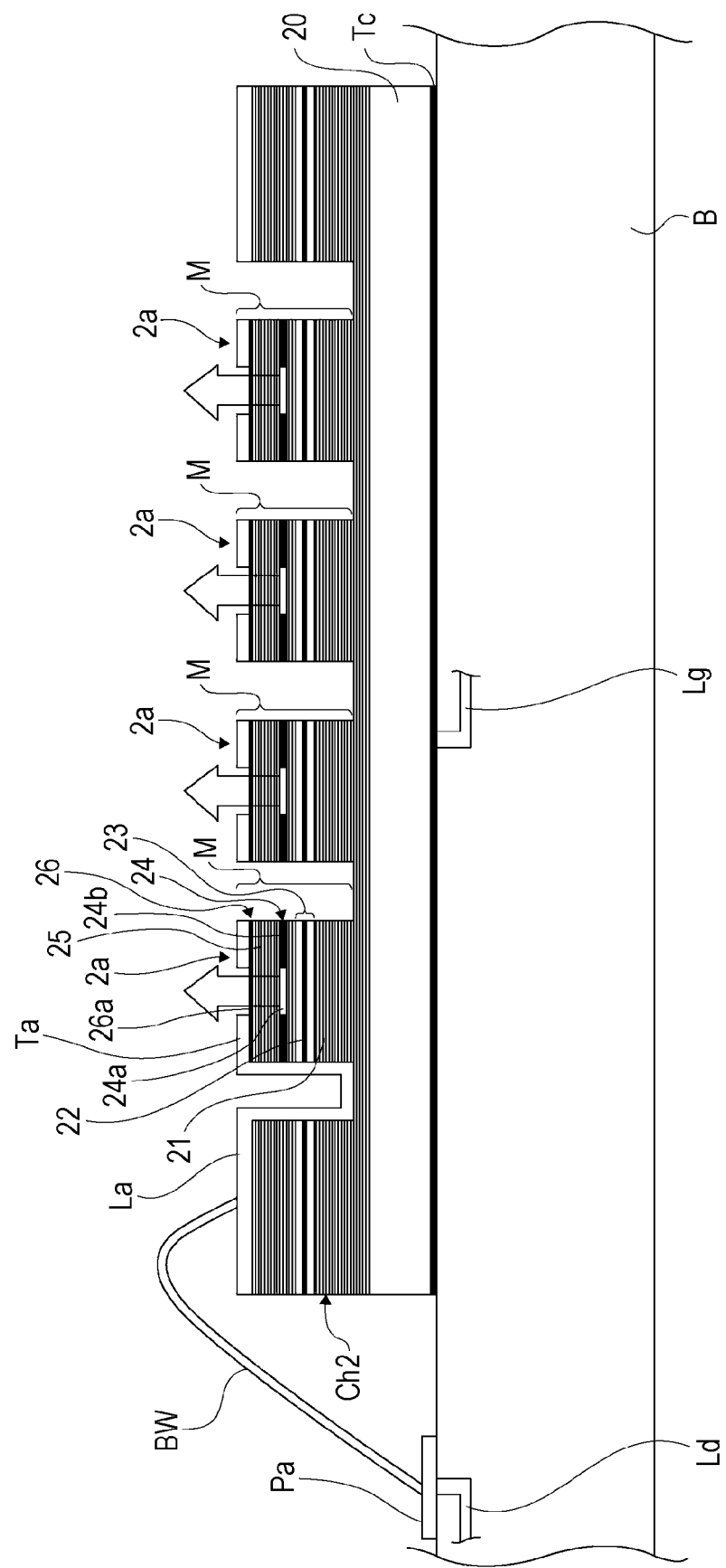
FIG. 10 is a diagram showing a structure example of a light emitting unit included in the light source device according to the embodiment.

FIG. 10 shows the structure example of the chip Ch2 in a case where the chip Ch2 is formed on the substrate B as in FIGS. 6A, 6B, and 8A. FIG. 11 shows the structure example of the chip Ch2 in a case where the chip Ch2 is mounted on another chip Ch as in FIGS. 7A to 7C and 8B.

Figure 11:
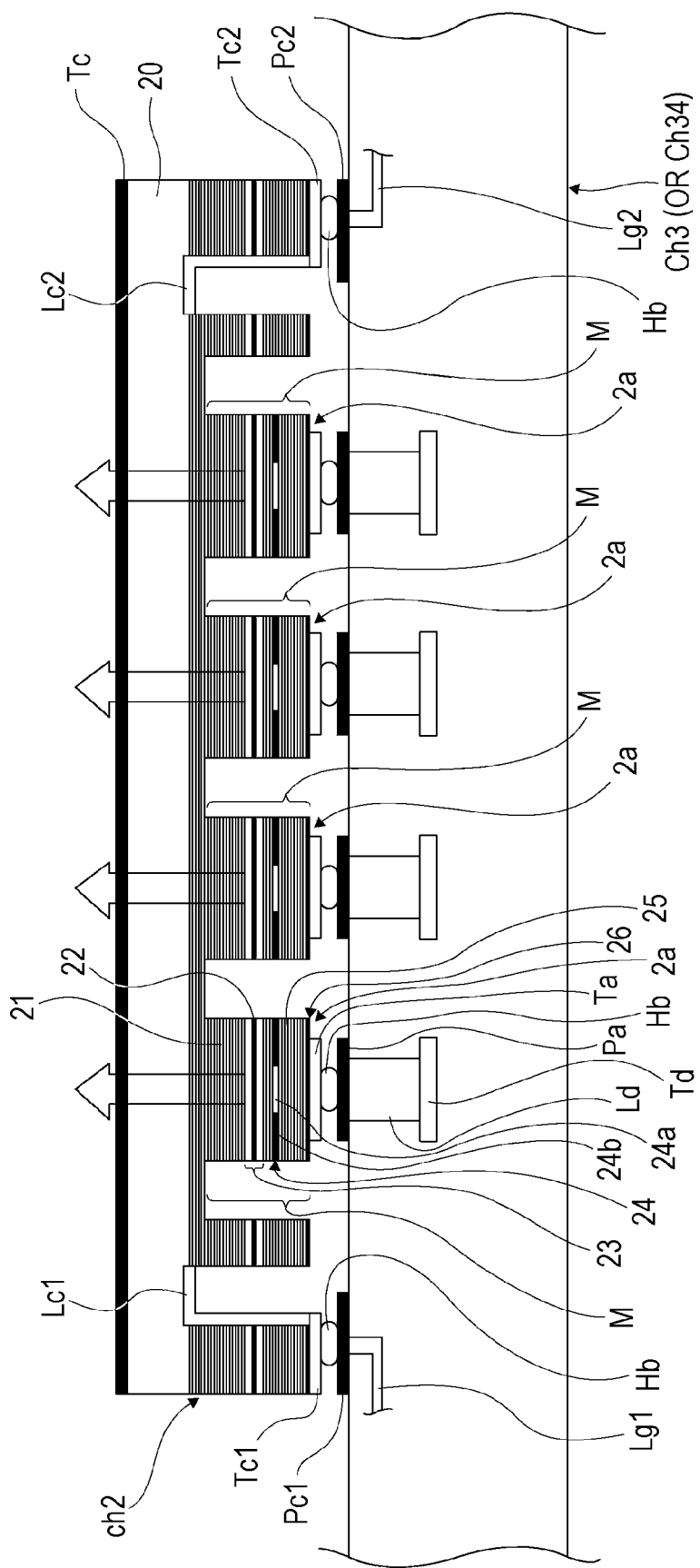
FIG. 11 is a diagram showing another structure example of the light emitting unit included in the light source device according to the embodiment.

Note that FIGS. 10 and 11 show, as one example, the structure example corresponding to the case where the drive circuit 30 is inserted into the anode side of the light emitting element 2a (see FIG. 3).

As shown in FIG. 10, in the chip Ch2, a part corresponding to each light emitting element 2a is formed as a mesa M.

A semiconductor substrate 20 is used as the substrate of the chip Ch2. A cathode electrode Tc is formed on a lower layer side of the semiconductor substrate 20. For the semiconductor substrate 20, for example, a gallium arsenide (GaAs) substrate is used.

On the semiconductor substrate 20, a first multilayer film reflector layer 21, an active layer 22, a second multilayer film reflector layer 25, a contact layer 26, and an anode electrode Ta are formed in the order from the lower layer side to the upper layer side in each mesa M.

A current constriction layer 24 is formed in a part (specifically, lower end) of the second multilayer film reflector layer 25. Furthermore, a part including the active layer 22 and sandwiched between the first multilayer film reflector layer 21 and the second multilayer film reflector layer 25 is a resonator 23.

The first multilayer film reflector layer 21 includes a compound semiconductor exhibiting N-type conductivity, and the second multilayer film reflector layer 25 includes a compound semiconductor exhibiting P-type conductivity.

The active layer 22 is a layer for generating laser light, and the current constriction layer 24 is a layer that efficiently injects an electric current into the active layer 22 to bring about a lens effect.

In the current constriction layer 24, after forming the mesa M, selective oxidation is performed in an unoxidized state. The current constriction layer 24 includes an oxidized region in the central portion (or selectively oxidized region) 24a and an unoxidized region 24b that is not oxidized around the oxidized region 24a. In the current constriction layer 24, a current constriction structure is formed by the oxidized region 24a and the unoxidized region 24b, and a current is conducted in the current constriction region as the unoxidized region 24b.

The contact layer 26 is provided to ensure ohmic contact with the anode electrode Ta.

The anode electrode Ta is formed on the contact layer 26, for example, in a shape in which a central portion such as an annular shape (ring shape) is opened when the substrate B is viewed in plan view. In the contact layer 26, a portion where the anode electrode Ta is not formed on the upper portion is an opening 26a.

Light generated in the active layer 22 reciprocates in the resonator 23 and then is emitted to the outside via the opening 26a.

Here, the cathode electrode Tc in the chip Ch2 is connected to the ground via a ground wire Lg formed in a wiring layer in the substrate B.

Furthermore, in the figure, a pad Pa represents a pad formed on the substrate B for the anode electrode. The pad Pa is connected to the drain of any one of the switching elements Q1 of the drive circuit 30 via a wire Ld formed in the wiring layer of the substrate B.

The figure shows that for only one light emitting element 2a, the anode electrode Ta is connected to one pad Pa via an anode wire La formed on the chip Ch2 and a bonding wire BW. The pad Pa and the wire Ld for each light emitting element 2a are formed on the substrate B, and the anode wire La for each light emitting element 2a is formed on the chip Ch2. The anode electrode Ta of each light emitting element 2a is connected to the corresponding pad Pa via the corresponding anode wire La and the bonding wire BW.

Subsequently, in a case of FIG. 11, a backlit chip Ch2 is used as the chip Ch2. That is, the chip Ch2 of a type that does not emit light in the upper layer side direction (front surface direction) of the semiconductor substrate 20 as in the example of FIG. 10, but emits light in the back surface direction of the semiconductor substrate 20 is used.

In this case, an aperture for emitting light is not formed in the anode electrode Ta, and the opening 26a is not formed in the contact layer 26.

In the chip Ch3 (or chip Ch34: hereinafter, similar in the description of FIG. 11) in which the drive unit 3 (drive circuit 30) is formed, the pad Pa for making an electrical connection with the anode electrode Ta is formed for each light emitting element 2a. In the wiring layer of the chip Ch3, the wire Ld is formed for each pad Pa. Although illustration is omitted, the wire Ld connects each pad Pa to the drain of one corresponding switching element Q1 in the drive circuit 30 formed in the chip Ch3.

Furthermore, in the chip Ch2, the cathode electrode Tc is connected to an electrode Tc1 and an electrode Tc2 via a wire Lc1 and a wire Lc2, respectively. The electrode Tc1 and the electrode Tc2 are electrodes for connecting to a pad Pc1 and a pad Pc2 formed on the chip Ch3, respectively.

A ground wire Lg1 connected to the pad Pc1 and a ground wire Lg2 connected to the pad Pc2 are formed in the wiring layer of the chip Ch3. Although illustration is omitted, the ground wires Lg1 and Lg2 are connected to the ground.

Connection of each anode electrode Ta in the chip Ch2 to each pad Pa in the chip Ch3, and connection of the electrode Tc1 and the electrode Tc2 in the chip Ch2 to the pad Pc1 and the pad Pc2 in the chip Ch3 are performed via solder bumps Hb, respectively.

That is, mounting of the chip Ch2 with respect to the chip Ch3 in this case is performed by so-called flip-chip mounting.

6. First Embodiment: Plurality of Light Emissions

As an operation of a first embodiment, a plurality of light emissions in the light source device 100 will be described. The plurality of light emissions mentioned here means that the light emitting unit 2 performs a plurality of light emissions in one frame on the image capturing device 101 side, that is, in one frame that is a period of exposure and image capturing of one piece of image in the image sensor 7.

To begin with, it will be described that in the light emitting unit 2 and the image sensor 7, light emission and exposure are synchronized.

Figure 12:
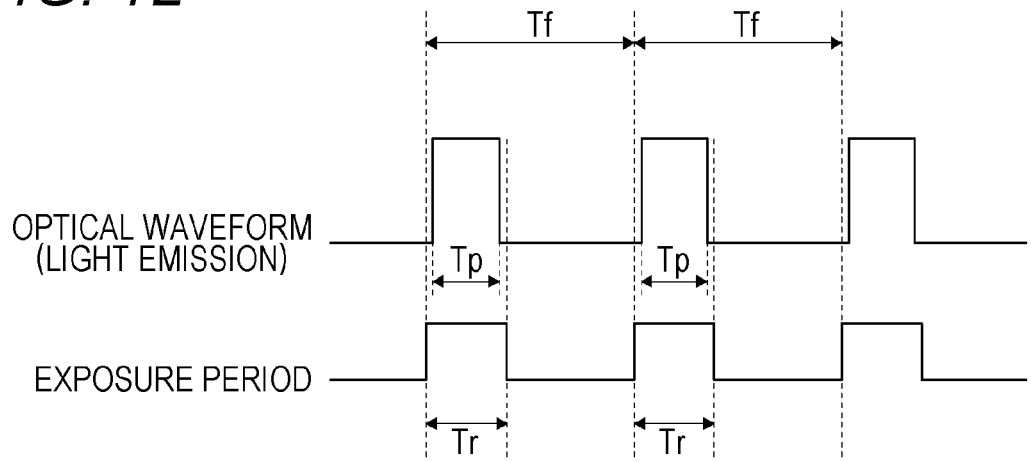
FIG. 12 is an explanatory diagram of a relationship between a light emission period and an exposure period according to the embodiment.

FIG. 12 shows a light emission period Tp of the light emitting elements 2a of the light emitting unit 2 and an exposure period Tr of the image sensor. In the example here, one light emission and one exposure are performed in one frame period Tf.

In one frame period Tf, a length of the exposure period Tr is variable on the image sensor 7 side. Adjustment is possible, for example, making Tr longer in a case where luminance is insufficient, and making Tr shorter to avoid saturation.

However, for the distance measuring device 1 of the present embodiment, it is assumed that the exposure period Tr and the light emission period Tp are synchronously controlled. This is because the distance measuring device 1 only wants to capture an image of reflected light of laser light from the subject S. In other words, this is because ambient light other than the laser light from the light emitting unit 2 is noise. That is, it is preferable to avoid exposure except in the light emission period Tp.

Therefore, for example, as shown in the figure, the light emission period Tp substantially agrees with the exposure period Tr. Therefore, the synchronization signal Fs is used between the drive unit 3 and the image sensor 7 as shown in FIG. 1, and the light emission period Tp and the exposure period Tr are defined.

Note that it is preferable that the light emission period Tp completely agrees with the exposure period Tr, but in FIG. 12, the exposure period Tr is slightly longer than the light emission period Tp. This is one example in which exposure is performed by covering the light emission period Tp with a slight margin. Although exposure is performed in the light emission period Tp, it is still preferable that exposure is not performed except in the light emission period Tp, and thus the margin period is shortened.

Furthermore, in some cases, the exposure period Tr may be shorter than the light emission period Tp, although there may be some useless laser output period in which exposure is not performed. That is, light is continuously emitted during the exposure period Tr.

In this way, the light emission period Tp does not necessarily have to completely agree with the exposure period Tr, but for the sake of description, it is assumed that setting the light emission period Tp to correspond to and substantially agree with the exposure period Tr is a state of "synchronization."

If it is assumed that such synchronization is achieved, there may be restrictions on adjustment of the periods.

Figure 13:
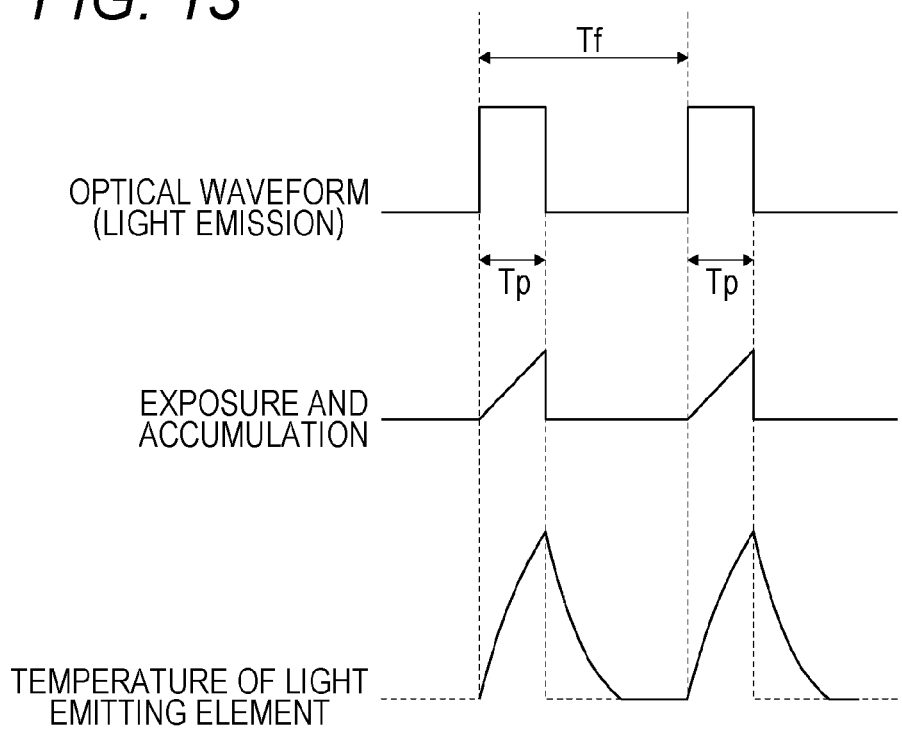
FIG. 13 is an explanatory diagram of temperature rise due to a light emission operation.

FIG. 13 shows the state of exposure and charge accumulation in the image sensor 7 and the temperature of the light emitting elements 2a corresponding to the waveform of the light emission period Tp.

As shown in the figure, the temperature of the light emitting elements 2a rises in the light emission period Tp, and the temperature of the light emitting elements 2a drops as the light emission stops. This indicates that the temperature rise becomes more remarkable as the light emission period Tp becomes longer.

Here, consider a situation where luminance of captured data is insufficient. This is a case where the luminance value is low at pixels required for detection for some reason and good sensing cannot be performed.

In such a case, it is considered to lengthen the exposure period Tr, but then the light emission period Tf of the light emitting elements 2a is also lengthened for synchronous control. In other words, there is no point in lengthening the exposure period Tr unless the light emission period Tp is also lengthened.

In a case where the light emitting elements 2a continue to emit light for a long time, there is a possibility that the temperature of the light emitting unit 2 rises due to heat generation, leading to a decrease in luminous efficiency and an oscillation stop due to high temperature.

Under such circumstances, the upper limit of the exposure time may be determined by the heat generated on the light source side, and therefore sensing precision may decrease because sufficient exposure cannot be performed and accurate coordinates cannot be detected from captured data, and the like.

Therefore, the present embodiment makes it possible to inhibit the temperature rise of the light source while implementing desired exposure time.

That is, in order to obtain one-time captured data, the light emitting unit 2 performs a plurality of light emissions in one frame. Distance measurement and 3D shape estimation of the subject S are performed using one piece of captured data (image) generated by the image sensor 7 accumulating the reflected light of the plurality of light emissions.

In other words, in implementing the desired exposure time, by dividing the light emission into a plurality of light emissions and synchronizing the exposure timing in order to inhibit the heat generation of the light source, equivalent images are obtained.

Figure 14:
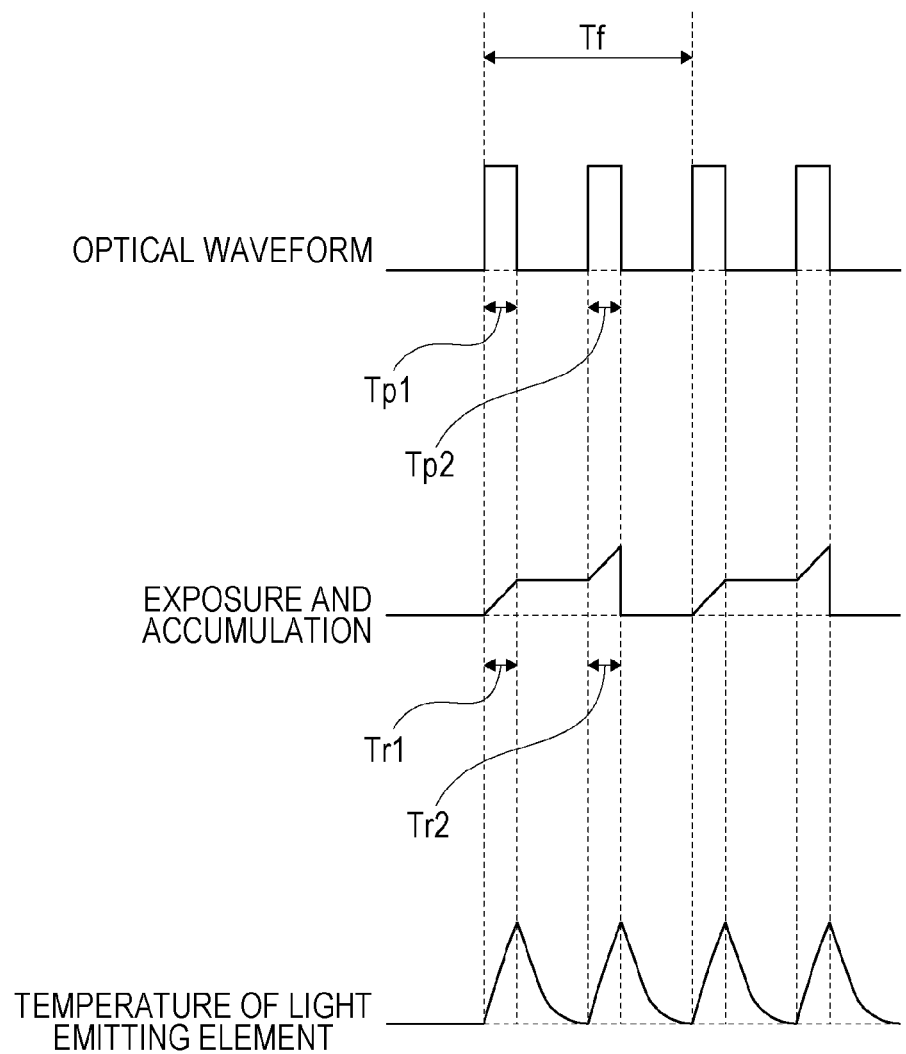
FIG. 14 is an explanatory diagram of an operation of a plurality of light emissions according to a first embodiment.

FIG. 14 shows an operation of the plurality of light emissions.

FIG. 14 shows an example in which the light emitting elements 2a perform two light emissions in one frame period Tf as light emission periods Tp1 and Tp2.

For example, it is assumed that the combined period length of the light emission periods Tp1 and Tp2 is a length approximately corresponding to the light emission period Tp of FIG. 13.

On the image sensor 7 side, exposure periods Tr1 and Tr2 are set in synchronization with the light emission periods Tp1 and Tp2, and exposure and charge accumulation are performed. The figure shows with a solid line how the charge is accumulated.

As described above, the temperature of the light emitting elements 2a rises during light emission and drops when the light emission stops, and thus rises during the light emission periods Tp1 and Tp2, but drops when the light emission periods Tp1 and Tp2 are finished. Since the light emission periods Tp1 and Tp2 are relatively short, the temperature rise that is finished relatively early and the following temperature drop will be repeated.

This makes it possible to inhibit the temperature rise of the light emitting unit 2 and allows charge accumulation for a sufficient time on the image sensor 7 side. Therefore, even if there is a lack of luminance in the captured data, the lack can be resolved.

Figure 15:
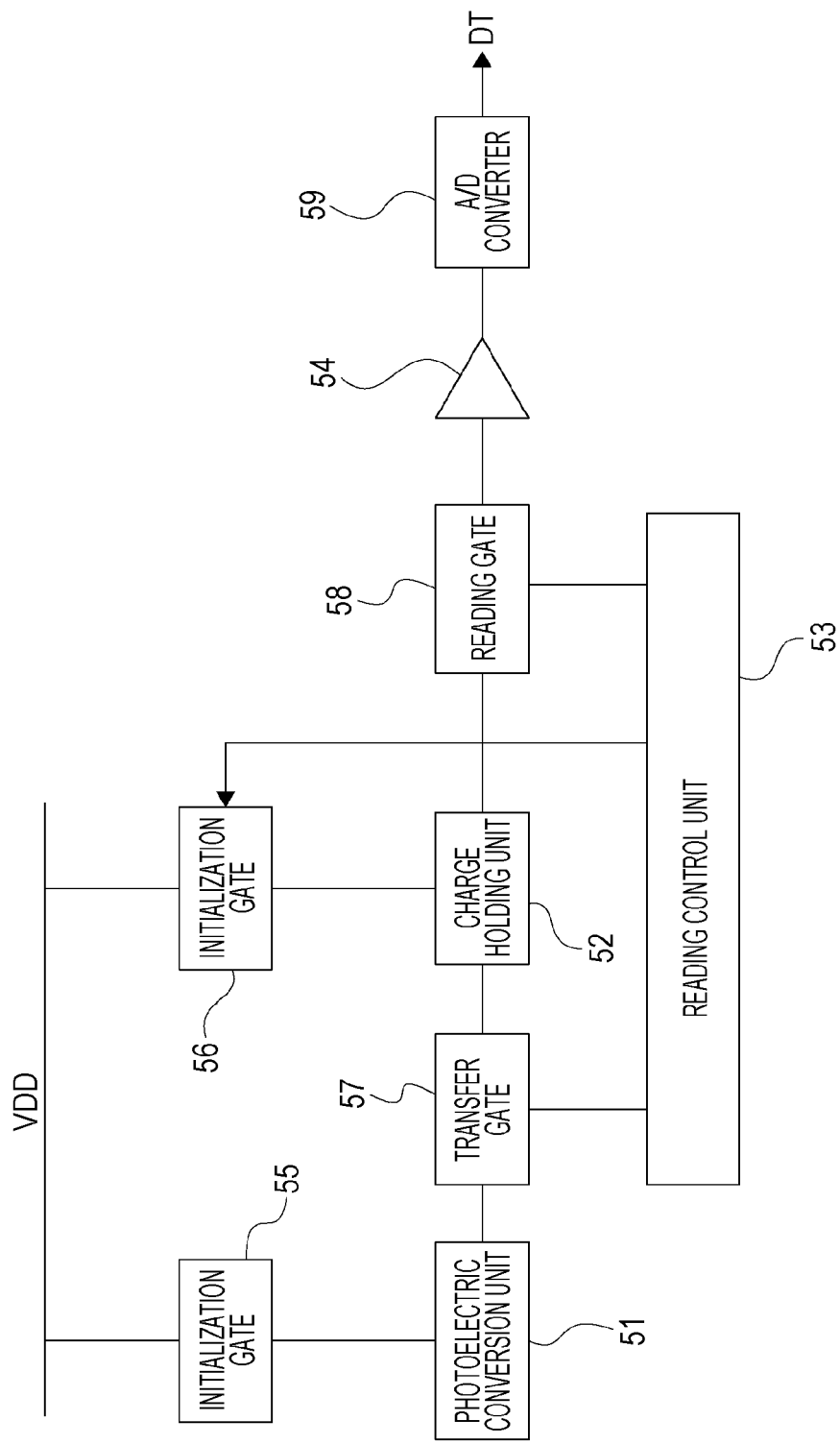
FIG. 15 is a block diagram of a configuration example of an image sensor that supports the plurality of light emissions according to the embodiment.

In order to perform divided exposure, for example, the image sensor 7 may have a configuration such as shown in FIG. 15.

The image sensor 7 includes a photoelectric conversion unit 51, a charge holding unit 52, a reading control unit 53, a reading amplifier 54, initialization gates 55 and 56, a transfer gate 57, a reading gate 58, and an A/D converter 59.

In the photoelectric conversion unit 51, photoelectric conversion elements to be exposed to reflected light from a subject are arranged. The photoelectric conversion unit 51 has a configuration in which the initialization gate 55 controls on/off of supply of a voltage VDD and performs initialization.

A charge (photoelectron) read from the photoelectric conversion unit 51 is supplied to the charge holding unit 52 via the transfer gate 57. The charge holding unit 52 temporarily holds the charge of each photoelectric conversion element (each pixel) of the photoelectric conversion unit 51. The charge holding unit 52 has a configuration in which the initialization gate 56 controls on/off of supply of the voltage VDD and performs initialization.

The charge of each pixel held by the charge holding unit 52 is read via the reading gate 58, undergoes amplification (gain control) processing by the reading amplifier 54, and then is converted into digital data by the A/D converter 59 and is output to the image processing unit 8 of FIG. 1 as captured data DT of one frame.

Figure 16:
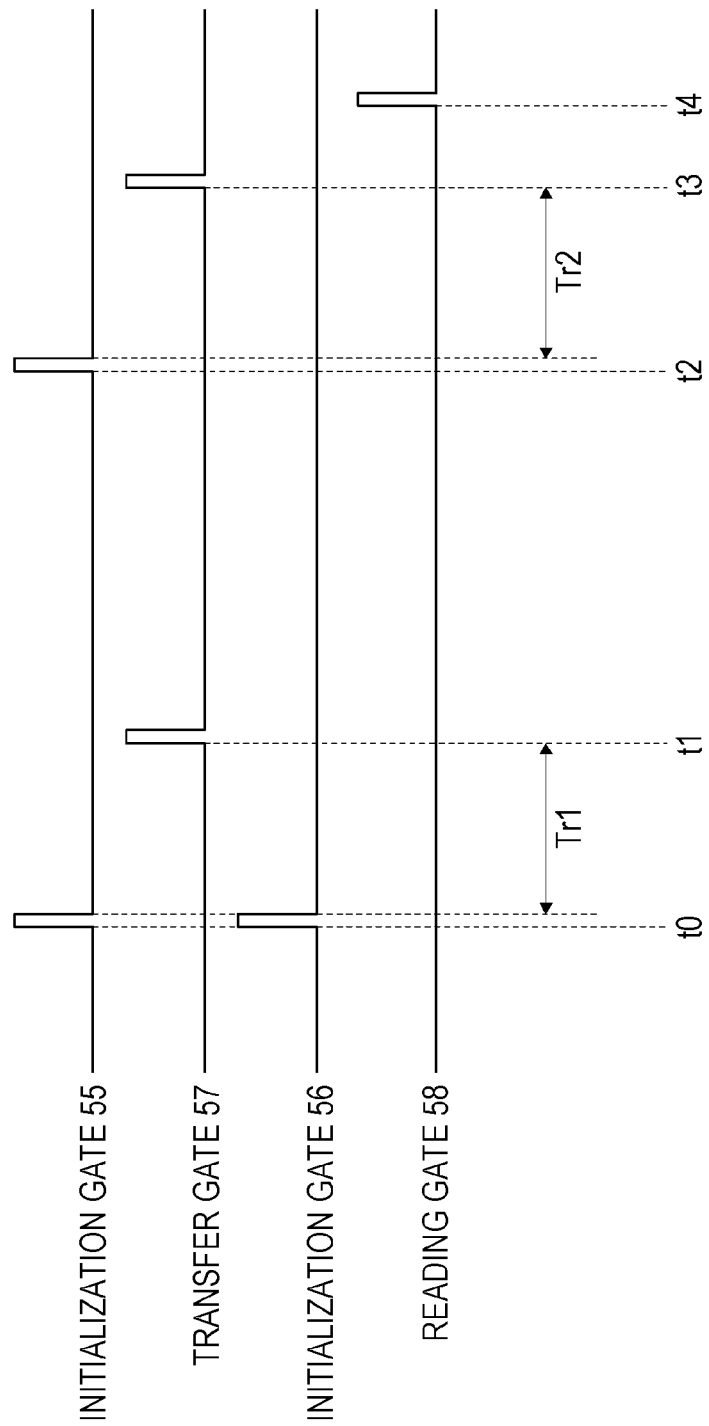
FIG. 16 is an explanatory diagram of operation timing of the image sensor that supports the plurality of light emissions according to the embodiment.

Here, the reading control unit 53 controls each gate as shown in FIG. 16, thereby implementing exposure corresponding to the plurality of light emissions as shown in FIG. 14.

To begin with, at time point t0, the reading control unit 53 causes the initialization gates 55 and 56 to initialize the photoelectric conversion unit 51 and the charge holding unit 52.

After the initialization, exposure is performed by the photoelectric conversion unit 51 as the exposure period Tr1.

At time point t1, the reading control unit 53 controls the transfer gate 57 to transfer the charge of each pixel accumulated in the photoelectric conversion unit 51 in the exposure period Tr1 to the charge holding unit 52.

However, at this time, the reading control unit 53 does not open the reading gate 58 such that the charge transferred from the photoelectric conversion unit 51 is held in the charge holding unit 52.

Thereafter, at time point t2, the reading control unit 53 controls the initialization gate 55 to initialize the photoelectric conversion unit 51. At this time, the charge holding unit 52 is not initialized.

After the initialization of the photoelectric conversion unit 51, exposure is performed by the photoelectric conversion unit 51 as the exposure period Tr2.

At time point t3, the reading control unit 53 controls the transfer gate 57 to transfer the charge of each pixel accumulated in the photoelectric conversion unit 51 in the exposure period Tr2 to the charge holding unit 52. The charge holding unit 52 holds the charge of the exposure period Tr2 in addition to the exposure period Tr1.

The reading control unit 53 controls the reading gate 58 at time point t4 to output the charge of each pixel held in the charge holding unit 52 to the reading amplifier 54.

By the above operation, the charges caused by two exposures of the exposure periods Tr1 and Tr2 are output as each pixel data of one-frame captured data DT constituting one piece of image.

Note that photoelectrons generated between the exposure period Tr1 and the exposure period Tr2 (from time point t1 to time point t2) are not accumulated in the charge holding unit 52 by releasing the initialization gate 55 at the time point t2, and are discarded to the voltage VDD line. By this control, the charge accumulated in the charge holding unit 52 is only the photoelectrons generated in the light emission periods Tp1 and Tp2. The obtained image is equivalent to an image in a case where the periods of the light emission periods Tp1 and Tp2 are continued.

Meanwhile, because of division into the light emission periods Tp1 and Tp2, light emission duration time of the light emitting elements 2a is shortened, and therefore the peak of the temperature rise caused by heat generation is lowered and the luminous efficiency is improved.

In that connection, FIG. 14 shows an example of performing two light emissions and exposures in one frame period Tf, but of course this is not limited to two.

Figure 17:
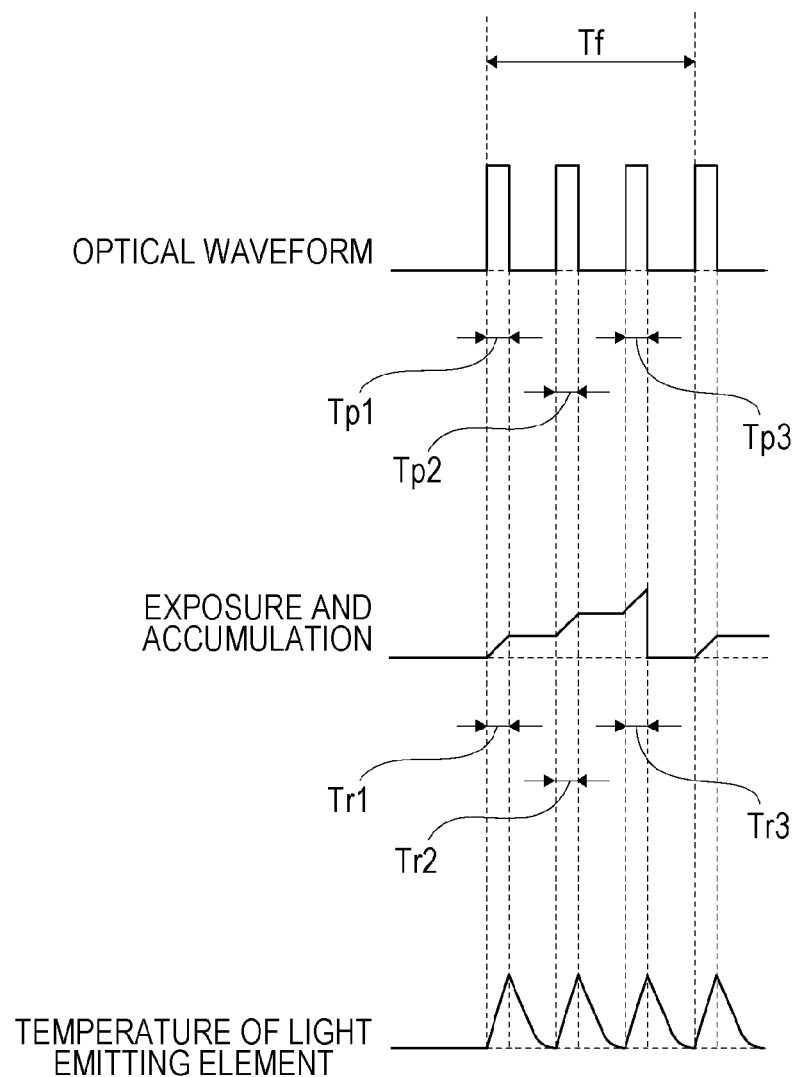
FIG. 17 is an explanatory diagram of a modified example of the operation of a plurality of light emissions according to the first embodiment.

FIG. 17 shows a case where three light emissions are performed in one frame period Tf. That is, the light emitting elements 2a perform light emissions of light emission periods Tp1, Tp2, and Tp3, and the image sensor 7 performs exposures of exposure periods Tr1, Tr2, and Tr3.

In this case, since the light emission periods Tp1, Tp2, and Tp3 are relatively short, the temperature of the light emitting elements 2a finishes temperature rise relatively early and shifts to temperature drop. Therefore, the temperature rise is inhibited more effectively.

For example, if the total light emission period length in one frame period Tf (Tp1+Tp2+Tp3 of FIG. 17) is equivalent to the total light emission period length of FIG. 14 (Tp1+Tp2 of FIG. 14), the temperature rise is inhibited more in three light emissions of FIG. 17 than in two light emissions of FIG. 14.

That is, as one light emission period is shortened and the number of light emissions in one frame period Tf increases, it is considered more advantageous in inhibiting the temperature rise.

Therefore, it is considered to perform light emission and exposure by division into four times, five times, or even more times in one frame period Tf. For example, 50 times, 100 times, or more times are also assumed.

It is considered to perform such a plurality of light emissions and plurality of exposures in one frame period Tf at all times during the sensing of the distance measuring device 1. By doing so, sensing that can inhibit the temperature rise at all times becomes possible.

Furthermore, it is also considered to switch between one continuous light emission and exposure in one frame period Tf and a plurality of light emissions and a plurality of exposures in one frame period Tf.

For example, in a case where image capturing can be performed well by exposure within a predetermined exposure time length, one continuous light emission and exposure in one frame period Tf are performed.

Meanwhile, in a case where it is desired to lengthen the exposure time because of insufficient light amount and the like, it is also considered to switch to a plurality of light emissions and a plurality of exposures in one frame period Tf to prevent the temperature rise on the light emitting unit 2 side from becoming large while increasing the amount of exposure time in one frame period Tf.

Moreover, in a case where a plurality of light emissions and a plurality of exposures are performed in one frame period Tf, it is considered to switch the number of times.

For example, as described above, in a case where a plurality of light emissions and a plurality of exposures are performed at all times in one frame period Tf, or in a case where a plurality of light emissions and exposures are performed by switching from one light emission and exposure in one frame period Tf, this is an operation to switch, for example, between two light emissions and exposures and three light emission and exposures as needed.

For example, when the exposure time is set at a value within a certain threshold, two light emissions and exposures are performed, and when the exposure time is desired to be longer than the threshold, three light emissions and exposures are performed, and the like. Of course, two or three light emissions and exposures is one example, and two or three or more light emissions and exposures may be performed.

Furthermore, since a plurality of light emissions and exposures in one frame period Tf particularly inhibits the temperature rise, it is considered to perform switching control according to the temperature condition as described below.

Furthermore, when controlling the above-described plurality of light emissions, regarding the plurality of light emissions in one frame period Tf, it is also considered to control the interval between the light emission periods Tp1 and Tp2 (length of non-light emission period). Since the non-light emission period is a period in which the temperature drops, the emission interval may be controlled to ensure that the temperature drops.

For example, the minimum length is secured as the light emission interval (non-light emission period), the temperature detection signal by the temperature detecting unit 10 is confirmed to shift to the next light emission period Tp on condition that the temperature falls to a predetermined temperature or lower, and the like.

Of course, such non-light emission period control is also possible by parameter control that defines each timing of the light emission periods Tp1, Tp2, . . . .

7. Second Embodiment: Plurality of Adaptive Light Emissions According to Temperature Hereinafter, as a second embodiment, an example of controlling a plurality of adaptive light emissions and exposures according to the temperature will be described.

To begin with, a first example of a plurality of adaptive light emissions according to the temperature will be described.

FIG. 18A shows a case of performing one light emission and exposure in one frame period Tf as shown in FIG. 13 above. That is, continuous light emission and exposure are performed in one frame period Tf with a light emission period Tp and an exposure period Tr. Temperature rise of light emitting elements 2a is relatively high.

In contrast, FIG. 18B shows a state where the temperature rise of the light emitting elements 2a is inhibited by suspending and resuming light emission and exposure according to the temperature.

That is, in FIG. 18B, in one frame period Tf, three divided light emissions and exposures are performed as light emission periods Tp1, Tp2, and Tp3, and exposure periods Tr1, Tr2, and Tr3.

In particular, a drive unit 3 or a control unit 9 monitors the temperature by a temperature detecting unit 10 in the light emission period Tp1 and controls the drive of the light emitting elements 2a.

For example, when the temperature of the light emitting elements 2a reaches a temperature threshold th1, the light emission of the light emitting elements 2a by the drive unit 3 is suspended. Thereafter, when it is detected that the temperature of the light emitting elements 2a drops to a temperature threshold th2, the light emission of the light emitting elements 2a by the drive unit 3 is resumed. That is, the light emission period Tp2 is started.

Similarly, the light emission period Tp2 is suspended when the temperature of the light emitting elements 2a reaches the temperature threshold th1. Furthermore, thereafter, when it is detected that the temperature of the light emitting elements 2a drops to the temperature threshold th2, the light emitting is resumed. That is, the light emission period Tp3 is started.

Here, for example, if the length of the light emission period Tp of FIG. 18A is a light emission period length TpG, the light emission periods Tp1, Tp2, and Tp3 of FIG. 18B are set such that Tp1+Tp2+Tp3=TpG. That is, in a case where the light emission period length TpG is set, the total period length of the divided light emissions is set at the light emission period length TpG.

Therefore, the light emission period Tp3 is finished when the total light emission time of the light emission periods Tp1, Tp2, and Tp3 reaches the light emission period length TpG.

Of course, in a case of FIG. 18B, the exposure periods Tr1, Tr2, and Tr3 in an image sensor 7 are controlled in synchronization with the light emission periods Tp1, Tp2, and Tp3, respectively.

Note that the figure shows an example in which three light emissions and exposures are performed, but this is not limited to three times because light emission is suspended and resumed and the light emission period length TpG is managed according to the temperature condition. It is also considered that the number of light emissions and exposures varies depending on the temperature condition at that time.

Such control of suspension and resumption of light emission may be performed by, for example, a logic circuit in the drive unit 3 and the like according to a detection signal by the temperature detecting unit 10, and the timing thereof may be transmitted to the image sensor 7. The control unit 9 may monitor the temperature detection signal by the temperature detecting unit 10 to synchronously control the drive unit 3 and the image sensor 7.

Figure 19:
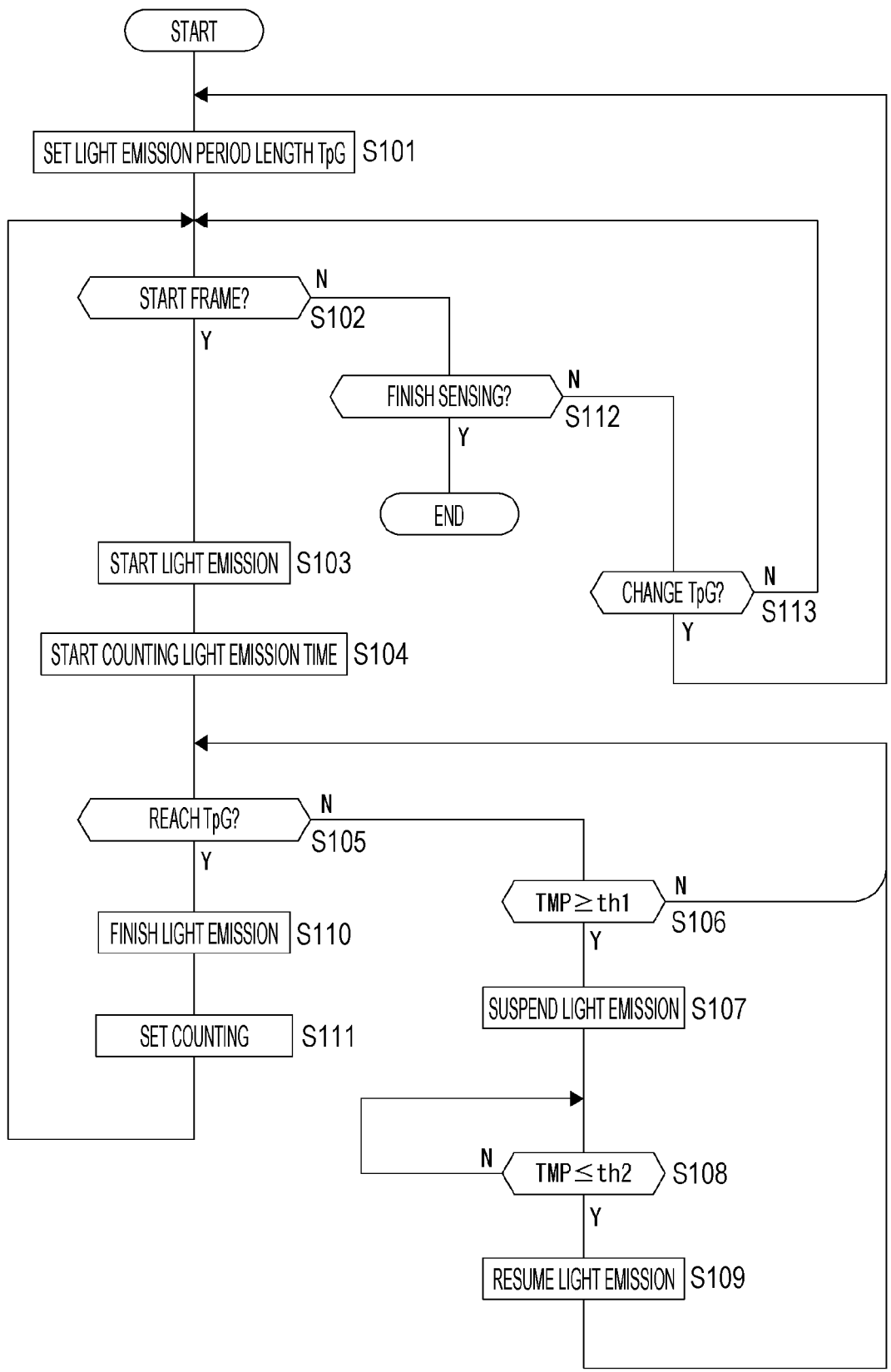
FIG. 19 is a flowchart of a first example according to the second embodiment.

FIG. 19 shows a processing example in which, for example, the control unit 9 controls the timing of suspending, resuming, and finishing light emission within one frame period Tf. The drive unit 3 may perform similar processing.

In step S101 of FIG. 19, to begin with, the control unit 9 sets the light emission period length TpG, which is the total light emission time in one frame period Tf.

Then, the control unit 9 proceeds from step S102 to S103 every time the start timing of one frame is detected from a frame synchronization signal.

In step S103, the control unit 9 instructs the drive unit 3 to start emitting light from a light emitting unit 2. Furthermore, the control unit 9 starts counting the light emission time in step S104.

In step S105, the control unit 9 confirms whether or not the value of the light emission time being counted reaches the light emission period length TpG.

If the value of the light emission time being counted does not reach the light emission period length TpG, in step S106, the control unit 9 checks the temperature detection signal by the temperature detecting unit 10 and confirms whether or not the current temperature (temperature of the light emitting elements 2a) TMP is equal to or higher than the temperature threshold th1.

In a case where the current temperature TMP does not reach the temperature threshold th1, the control unit 9 continues monitoring of steps S105 and S106.

In a case where it is detected that the current temperature TMP is equal to or higher than the temperature threshold th1, the control unit 9 proceeds from step S106 to S107 to control light emission suspension. That is, the control unit 9 causes the drive unit 3 to suspend the light emission of the light emitting unit 2, and instructs the image sensor 7 to suspend the exposure.

After performing the light emission suspension control, the control unit 9 checks the temperature detection signal by the temperature detecting unit 10 in step S108, and confirms whether or not the current temperature TMP is equal to or lower than the temperature threshold th2. Until the current temperature TMP drops equal to or lower than the temperature threshold th2, the suspended state will continue as it is.

In a case where it is detected that the current temperature TMP is equal to or lower than the temperature threshold th2, the control unit 9 proceeds from step S108 to S109 to control light emission resumption. That is, the control unit 9 causes the drive unit 3 to resume the light emission of the light emitting unit 2, and instructs the image sensor 7 to resume the exposure.

Then, the control unit 9 returns to the monitoring of steps S105 and S106.

If it is detected that the value of the light emission time being counted in step S105 reaches the light emission period length TpG, the control unit 9 proceeds to step S110 and instructs the drive unit 3 and the image sensor 7 to finish the light emission and exposure within the current frame period Tf.

Then, the control unit 9 resets a light emission time counter, returns to step S102, and waits for start timing of the next frame.

Note that in this waiting period, if sensing is finished in step S112, the control of FIG. 19 is finished at the time point.

Furthermore, for example, in a case where a situation such as it is desired to increase the exposure time occurs due to insufficient luminance or some other condition, the control unit 9 changes the light emission period length TpG accordingly. In a case where the control unit 9 changes the light emission period length TpG due to various reasons, the control unit 9 returns from step S113 to S101 and changes the setting of the light emission period length TpG.

As the control of FIG. 19 described above is performed, as shown in FIG. 18B, one light emission duration time is controlled according to the temperature condition. With this control, the operation of performing a plurality of light emissions and exposures in one frame period Tf is performed.

Note that in a case where the above operation is performed, in a situation where the temperature frequently rises equal to or higher than the temperature threshold th1, there is a possibility that a situation may occur where the total light emission time cannot reach the light emission period length TpG in one frame period. The temperature thresholds th1 and th2 are preferably set appropriately such that such a situation does not occur. Alternatively, considering that, as a distance measuring device 1, one frame period Tf of image capturing does not necessarily have to be fixed, one frame period Tf may be variable and the control of FIG. 19 according to the current temperature TMP may be prioritized.

Subsequently, a second example of processing for performing a plurality of adaptive light emissions according to the temperature will be described.

This is an example of switching between one light emission, two light emissions, and three light emissions in one frame period Tf according to the temperature condition.

An example of control by the control unit 9 will be described in FIG. 20A.

In step S150, the control unit 9 starts light emission and exposure as one light emission in one frame period Tf. For example, the operation as in FIG. 13 is performed.

Note that at such start time point, flags FT1 and FT2, which will be described later, are turned off. The flag FT1 is a flag indicating a state in which two light emissions are being performed, and the flag FT2 is a flag indicating a state in which three light emissions are being performed.

The control unit 9 monitors the finish of sensing in step S151.

In step S152, the control unit 9 checks the current temperature TMP (temperature of the light emitting elements 2a) from the temperature detection signal by the temperature detecting unit 10.

Then, in steps S153, S154, S155, and S156, the control unit 9 performs processing of monitoring the current temperature or flag status.

In step S153, it is confirmed whether or not the current temperature TMP is equal to or higher than a certain temperature threshold th20 when the flag FT2 is off.

In step S154, it is confirmed whether or not the flag FT2 is turned on.

In step S155, it is confirmed whether or not the current temperature TMP is equal to or higher than a certain temperature threshold th10 when the flag FT1 is off.

In step S156, it is confirmed whether or not the flag FT1 is turned on.

In a case where the flag FT1 is off and the current temperature TMP is higher than the certain temperature threshold th10, the control unit 9 proceeds from step S155 to S164, and performs control to switch to the operation of performing two light emissions in one frame period Tf.

That is, from the next frame, the control unit 9 instructs the drive unit 3 to perform two light emissions of the light emission periods Tp1 and TP2 as in FIG. 14, and instructs the image sensor 7 to perform two exposures of the exposure periods Tr1 and Tr2.

Then, in step S165, the control unit 9 turns on the flag FT1.

In a period in which the flag FT1 is on, the control unit 9 monitors step S153 or S156.

Since the temperature rise can be inhibited by switching to two light emissions, it is considered that the current temperature TMP will drop.

Therefore, in a case where the flag FT1 is on, the control unit 9 proceeds from step S156 to S166 to determine whether or not the current temperature TMP is equal to or lower than a temperature threshold th10u.

Here, the temperature threshold th10u is a temperature slightly lower than the temperature threshold th10 for shifting to two light emissions as shown in FIG. 20B.

If the current temperature TMP is equal to or lower than the temperature threshold th10u, the control unit 9 proceeds to step S167, and performs control to switch to one light emission in one frame period Tf.

That is, from the next frame, the control unit 9 instructs the drive unit 3 to perform one light emission of the light emission period Tp as in FIG. 13, and instructs the image sensor 7 to perform exposure of the exposure period Tr.

Then, in step S168, the control unit 9 turns off the flag FT1.

Note that since the temperature threshold th10u is slightly lower than the temperature threshold th10, a situation where two light emissions and one light emission are frequently switched is prevented.

Even in a period when the flag FT1 is on and two light emissions are performed, the temperature may rise further. Therefore, the control unit 9 monitors in step S153 whether or not the current temperature TMP is equal to or higher than the temperature threshold th20.

The temperature threshold th20 is a temperature higher than the temperature threshold th10, as shown in FIG. 20B.

If the current temperature TMP is higher than the temperature threshold th20, the control unit 9 proceeds from step S153 to S160, and performs control to switch to three light emissions in one frame period Tf.

That is, from the next frame, the control unit 9 instructs the drive unit 3 to perform three light emissions of the light emission periods Tp1, Tp2, and Tp3 as in FIG. 17, and instructs the image sensor 7 to perform three exposures of the exposure periods Tr1, Tr2, and Tr3.

Then, in step S161, the control unit 9 turns on the flag FT2.

In a period in which the flag FT2 is on, the control unit 9 monitors step S154.

Since the temperature rise can be further inhibited by switching to three light emissions, it is considered that the current temperature TMP will drop.

Therefore, in a case where the flag FT2 is on, the control unit 9 proceeds from step S154 to S162 to determine whether or not the current temperature TMP is equal to or lower than a temperature threshold th20u. Here, the temperature threshold th20u is a temperature slightly lower than the temperature threshold th20 for shifting to three light emissions as shown in FIG. 20B.

If the current temperature TMP is equal to or lower than the temperature threshold th20u, the control unit 9 turns off the flag FT2 in step S163 and further proceeds to step S164, and performs control to switch to two light emissions in one frame period Tf. That is, the control unit 9 returns from three light emissions to two light emissions. At this time, if the flag FT1 is off, the flag FT1 will be turned on in step S165.

Note that since the temperature threshold th20$u$ is slightly lower than the temperature threshold th20, a situation where three light emissions and two light emissions are frequently switched is prevented.

As described above, according to the temperature condition, the number of light emissions and exposures in one frame period Tf is switched among one time, two times, and three times. Then, at the time point when the sensing is finished, the control unit 9 finishes the processing of FIG. 20A from step S151.

By doing so, inhibition of the temperature rise caused by a plurality of light emissions is effectively performed. Furthermore, when the temperature rise is not large, the control of the sensing operation becomes simple because one light emission and exposure are performed.

As the second embodiment described above, in the distance measuring device 1, by controlling the light emission interval, the light emission duration time per time, and the number of light emissions at the timing of a plurality of light emissions or exposures performed to obtain one-time image, it is possible to inhibit heat generation of the light source and improve power efficiency.

8. Third Embodiment: Number of Exposures Different in Plane

As a third embodiment, an example in which light emission and exposure is performed in a different number of times according to an exposed surface of an image sensor 7 will be described.

FIG. 21A shows an example in which a light emitting unit 2 performs, for example, four light emissions (light emission periods Tp1, Tp2, Tp3, Tp4) in one frame period Tf as shown as an optical waveform.

Furthermore, FIG. 21A shows how an amount of accumulated charge increases as an exposure operation of pixels G1 and G2 in accordance with a light emission operation.

In the pixel G1, exposure of exposure periods Tr1 and Tr2 is performed in accordance with the light emission periods Tp1 and Tp2. However, no exposure is performed in the light emission periods Tp3 and Tp4.

In the pixel G2, exposure of exposure periods Tr1, Tr2, Tr3, and Tr4 is performed in accordance with the light emission periods Tp1, Tp2, Tp3, and Tp4.

Here, it is assumed that the pixel G1 is, for example, as shown in FIG. 21B, a pixel near the center of an image capturing surface of the image sensor 7 (photoelectric conversion unit 51) and having relatively high sensitivity.

Meanwhile, it is assumed that the pixel G2 is, for example, a pixel near a screen end of the image capturing surface and having relatively low sensitivity.

In a case where the pixel G1 with high sensitivity becomes saturated if exposure time is lengthened, if the exposure time is shortened uniformly, a situation may occur in which luminance is insufficient in the pixel G2.

Therefore, the number of exposures to a plurality of light emissions can be set according to the pixel. This makes it possible, even in a case where there is a difference in pixel sensitivity, to obtain captured data in which any pixel is in a good luminance range.

Note that the pixel sensitivity is affected not only by the characteristics of the pixel but also by the characteristics of a light emitting element 2$a$. For example, the degree of temperature rise is greater near the center of the light emitting unit 2 than in an end. A laser light emitting element as VCSEL has a characteristic that power decreases as the temperature rises. Therefore, the amount of light of the light emitting element 2$a$ may drop as disposed closer to the central portion.

For example, due to such circumstances, the luminance may drop near the center of the image capturing surface of the image sensor 7. In such a case, it is considered to increase the number of exposures in the pixel G1 near the center.

Furthermore, FIG. 21A also shows an example as a pixel G3, and in this case, in the exposure period Tr3, the exposure is finished in the middle of the light emission period Tp3.

In this way, not only by the exposure according to the light emission period, but also by finishing the exposure in the middle of a certain light emission period, it is also possible to perform control to equalize the luminance.

As described above, in synchronization with a plurality of light emissions of the light source device 100, by individually controlling the exposure duration time and the number of exposures per one time for each pixel or each block including a number of pixels in the image capturing surface of the image sensor 7, it is possible to configure a distance measuring device 1 to control the luminance of the reflected light image of the light source reflected by the subject S on the image captured by the image sensor 7.

9. Fourth Embodiment: Individual Setting of Light Emission Parameter

Subsequently, as a fourth embodiment, individual setting of a light emission parameter will be described.

In a distance measuring device 1 in which a light source device 100 causes a large number of light emitting elements 2$a$ to emit light and reflected light thereof is captured by an image capturing device 101 to measure a distance, luminance of a bright spot on an obtained image is not always uniform due to manufacturing variations of lasers (light emitting elements 2$a$), temperature fluctuations, and optical system characteristics.

Figure 22:
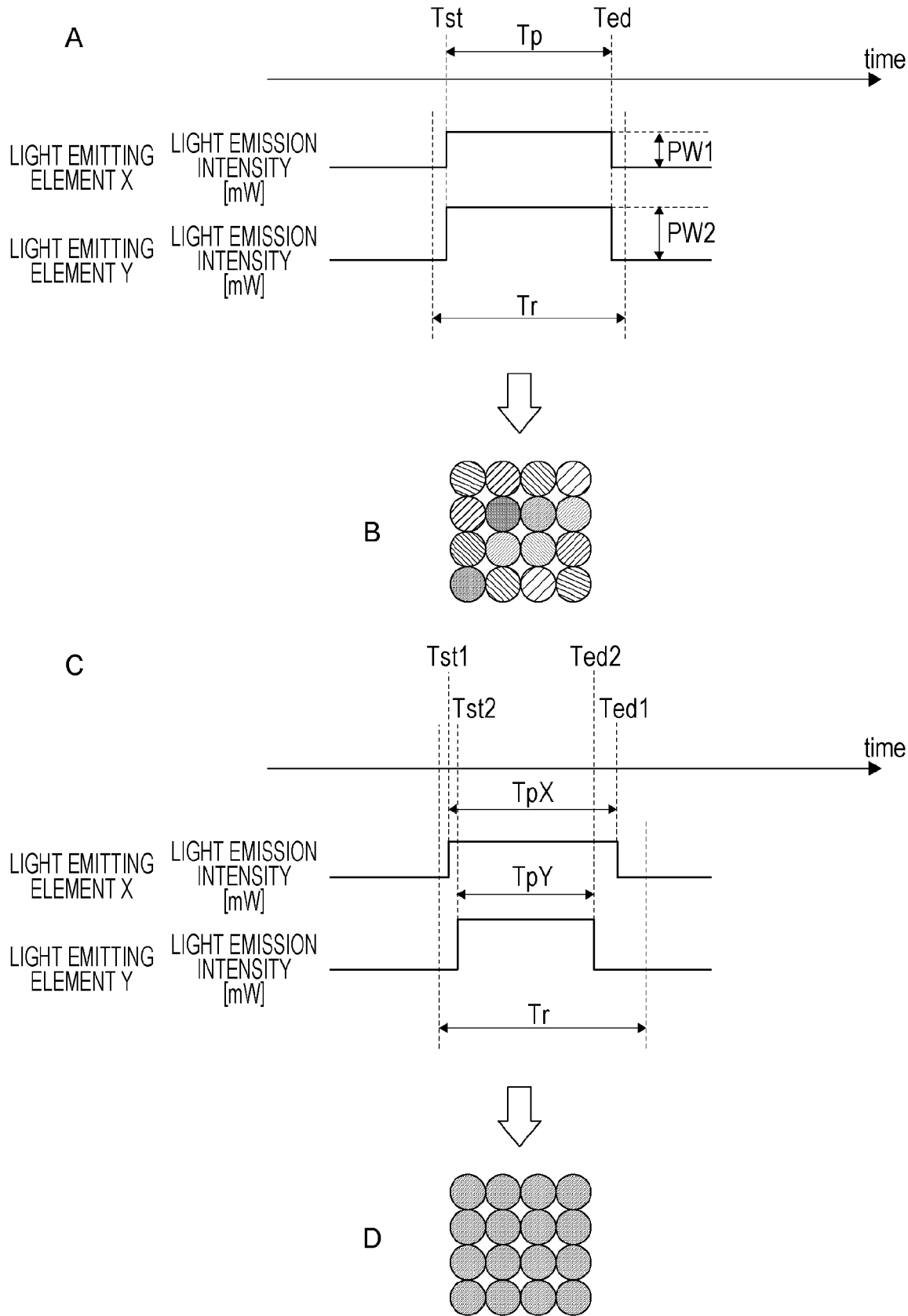
FIG. 22 is an explanatory diagram of individual setting of a light emission parameter according to a fourth embodiment.

For example, in FIG. 22A, light emitting elements X and Y emit light only in a light emission period Tp defined by start timing Tst and end timing Ted. On an image sensor 7 side, exposure is performed in an exposure period Tr synchronized therewith. Note that in this case as well, the meaning of "synchronization" is as described above.

Here, it is assumed that the light emitting elements X and Y are samples of certain two light emitting elements 2$a$ referred to in the description among the large number of light emitting elements 2$a$.

FIG. 22A shows that light emission intensity PW1 and PW2 cannot be equalized due to manufacturing variations, temperature distribution, parasitic resistance, and the like even though driving of the light emitting elements X and Y are controlled with the same parameter.

Figure 23:
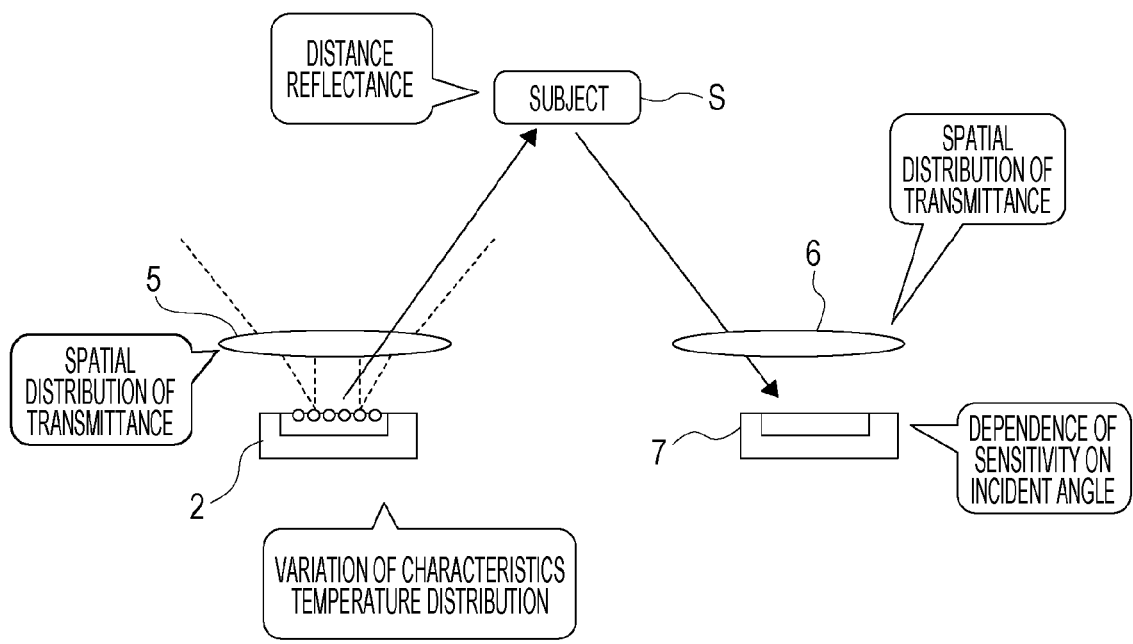
FIG. 23 is an explanatory diagram of variable factors to be adjusted according to the fourth embodiment.

In addition to such variations in light emission intensity, as further shown in FIG. 23, there are factors that affect an amount of light reaching the image sensor 7.

That is, the factors include spatial distribution of transmittance of a light emission side optical system 5, a distance from the distance measuring device 1 to a subject S, reflectance of the subject S, spatial distribution of transmittance of an image capturing side optical system 6, dependence of sensitivity of the image sensor 7 on an incident angle, and the like.

FIG. 22B schematically shows how the image sensor 7 captures reflected light of the subject S illuminated in such a situation. As shown in the figure, each pixel (or each pixel block) appears as a variation in brightness.

Therefore, if exposure (gain/exposure time) is adjusted in accordance with a dark spot, a bright spot will be saturated and accurate coordinates cannot be obtained.

Similarly, if exposure is adjusted in accordance with the bright spot, the dark spot will not appear and accurate coordinates cannot be obtained in the same way.

Therefore, as the fourth embodiment, for each of multi-lamp light sources or each block including a plurality of light sources, by controlling lighting start time, lighting end time, or a current amount so as to differ depending on the situation, luminance of reflected light on the captured image is adjusted to a desired amount.

In particular, at that time, in order to determine ON/OFF timing of a current and a current amount, two-dimensionally distributed light sources are captured as a two-dimensional image with the image sensor 7, and the current or light emission time or both of each block of the light sources are controlled such that brightness in the image becomes a desired state.

In this case, since the light emission side optical system 5, the subject S, and an image capturing side optical system 6 are on the optical path from a light emitting unit 2 to the image sensor 7, it is possible to perform control considering not only the manufacturing variation of the multi-lamp light source but also the variation caused by each component on the optical path described above.

Then, an idea of the present embodiment is to perform control, not to aim to shine at desired brightness in the light emitting unit 2, but to appear in a desired way on the image sensor 7 side.

FIG. 22C shows one example of individually controlling the light emission timings of the light emitting elements X and Y.

Light emission of the light emitting element X is controlled by start timing Tst1 and end timing Ted1. Light emission of the light emitting element Y is controlled by start timing Tst2 and end timing Ted2. With this configuration, the lengths of light emission periods TpX and TpY of the light emitting elements X and Y are different from each other.

In this way, by setting the length of the light emission period Tp for each light emitting element 2a (or for each predetermined block), as shown in FIG. 22D, variations in luminance between pixels (or between pixel blocks) of captured data captured by the image sensor 7 are prevented.

In other words, the light emission timings of the light emitting elements X and Y are controlled such that the luminance variation between pixels of the captured data does not occur.

The example of FIG. 22C is one example.

Figure 24:
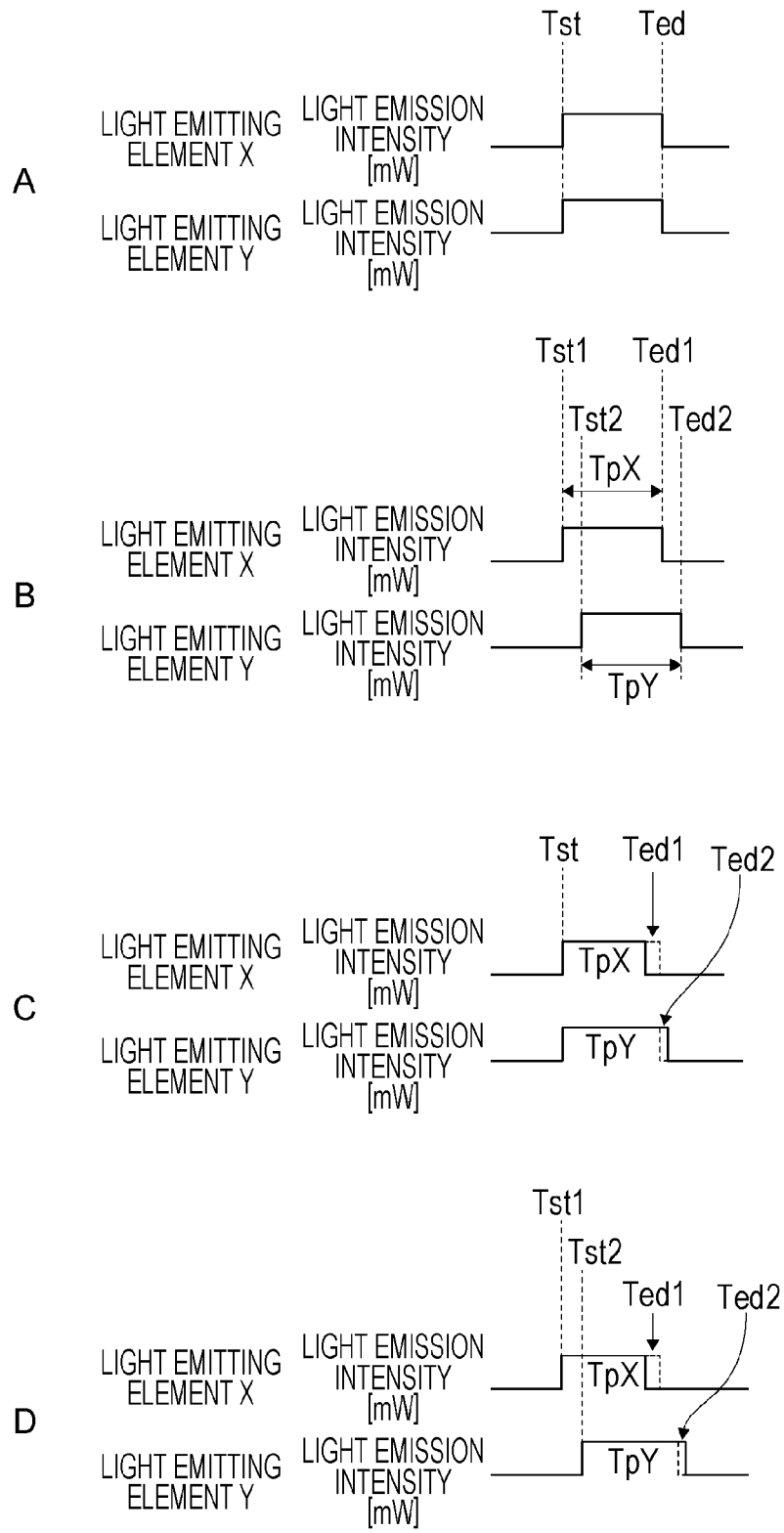
FIG. 24 is an explanatory diagram of an example of adjusting light emission drive according to the fourth embodiment.

FIG. 24 shows various control examples.

FIG. 24A is an example of causing the light emitting elements X and Y to emit light at the same start timing Tst and end timing Ted for comparison.

FIG. 24B is an example in which the start timings Tst1 and Tst2 of the light emitting elements X and Y are shifted, and the end timings Ted1 and Ted2 are shifted. In this case, the light emission periods TpX and TpY of the light emitting elements X and Y can be made different depending on an amount of timing shift.

Note that in a case where there is no problem in luminance variations on captured data, by shifting the start timing Tst2 and the end timing Ted2 by the same amount with respect to the start timing Tst1 and the end timing Ted1, the light emission periods TpX and TpY can be equalized. By shifting the start and end timing of light emission in the light emitting elements X and Y, an advantage is obtained that a sudden change in current in power supply wiring within a chip of a drive unit 3 can be avoided.

FIG. 24C is an example in which the start timing Tst is common to the light emitting elements X and Y, but the end timings Ted1 and Ted2 are different timings as needed.

By making the light emission periods TpX and TpY different from each other, it is possible to reduce the luminance variation on the image sensor 7 side.

Furthermore, by adjusting the end timing Ted in this way, it is possible to perform injection that cancels spatial distribution of transmittance of the optical systems (5, 6). Moreover, it is possible to perform injection that cancels spatial distribution of reflectance of the subject S. Moreover, it is possible to perform injection that cancels a difference in distance between the distance measuring device 1 and the subject S.

FIG. 24D is an example in which the start timings Tst1 and Tst2 are fixedly shifted and the end timings Ted1 and Ted2 are different timings as needed in the light emitting elements X and Y.

With this configuration as well, effects described in FIGS. 24C and 24B described above can be obtained.

Note that although not shown in the figure, it is also considered to perform control such that in the light emitting elements X and Y, the end timing Ted is common and the start timings Tst1 and Tst2 can be changed as needed.

Moreover, in the light emitting elements X and Y, regardless of whether or not light emission timings are the same or different, it is also considered to make the output laser power (drive current amount) different.

Moreover, as parameter setting, it is also considered to perform a plurality of light emissions and exposures in one frame period Tf as described in the first to third embodiments.

By performing a plurality of light emissions, in a case where the exposure time is insufficient, an amount of received light can be increased while inhibiting the temperature rise as described above. Therefore, as timing control with the light emission parameter, timing setting for a plurality of light emissions is also assumed.

An operation of the fourth embodiment as described above is to variably control the parameter to be given to the drive unit 3 for laser light emission according to the captured data on the image sensor 7 side. Static parameter control and dynamic parameter control can be considered as a method of parameter control.

The static parameter control is to perform calibration according to a fixed situation to set the parameter.

Figure 25:
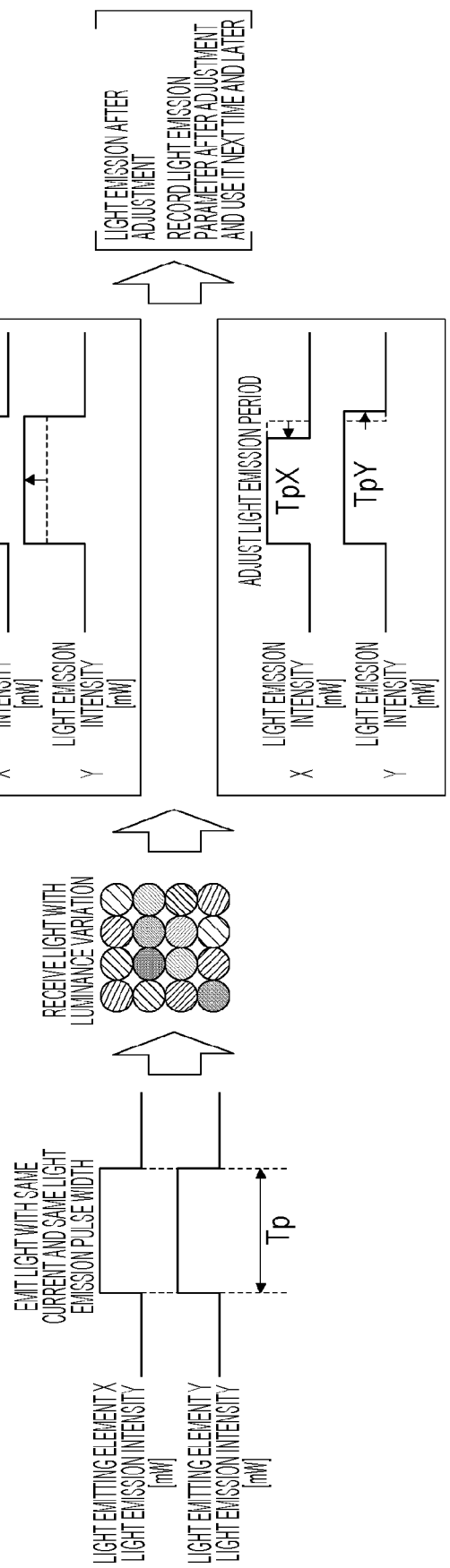
FIG. 25 is an explanatory diagram of an example of static control according to the fourth embodiment.

For example, as shown in FIG. 25, to begin with, the light emitting elements X and Y emit light with the same parameter. That is, light emission is driven by using the same values (same light emission period Tp) as the laser power, the start timing Tst, and the end timing Ted.

In this case as well, luminance variation occurs in the captured data depending on the individual variation of the light emitting elements 2a, the optical system, and the subject. Therefore, the parameters of the light emitting elements X and Y are set individually so as to resolve the luminance variation. For example, the current values are set differently, or the timing parameters are changed to make the light emission periods TpX and TpY different from each other.

Meanwhile, the dynamic parameter control is to adaptively set the parameters variably according to the situation changing during sensing.

Figure 26:
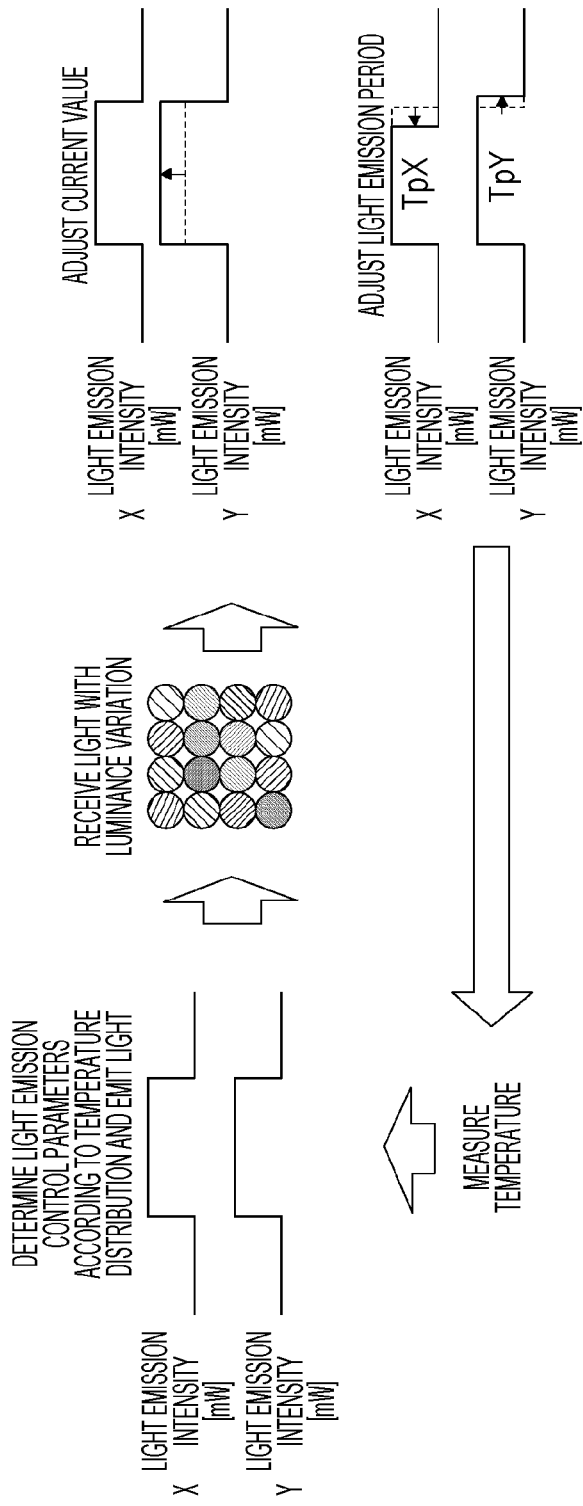
FIG. 26 is an explanatory diagram of an example of dynamic control according to the fourth embodiment.

For example, as shown in FIG. 26, to begin with, the parameters of the light emitting elements X and Y are determined according to the initial temperature distribution of the light emitting unit 2 to emit light. Note that it can be considered that after the static parameter control is performed, the parameter setting according to the initial temperature distribution is included therein.

Thereafter, in a case where the luminance variation occurs due to the temperature change during sensing, the parameters of the light emitting elements X and Y are set individually so as to resolve the luminance variation. For example, the current values are set differently, or the timing parameters are changed to make the light emission periods TpX and TpY different from each other.

Note that in both cases, in a case where the light emission period Tp is set differently in the light emitting elements X and Y depending on the light emission parameter, considering the point of synchronization between the light emission period and the exposure period described above, it is assumed that the exposure period Tr is also set individually different accordingly.

However, in a case where the exposure period cannot be variably controlled for each individual pixel (or block pixel) on the image sensor 7 side, it is considered to set the exposure period to perform exposure in the period from the earliest start timing Tst to the latest end timing Ted among the earliest parameters for the plurality of light emitting elements 2a.

10. Parameter Setting Processing Example

A parameter setting processing example in the fourth embodiment will be described below. It is assumed that the processing example described below is processing to be performed by a control unit 9. As described above, the control unit 9 may be a separate body from the drive unit 3 or may be provided within the drive unit 3.

Figure 27:
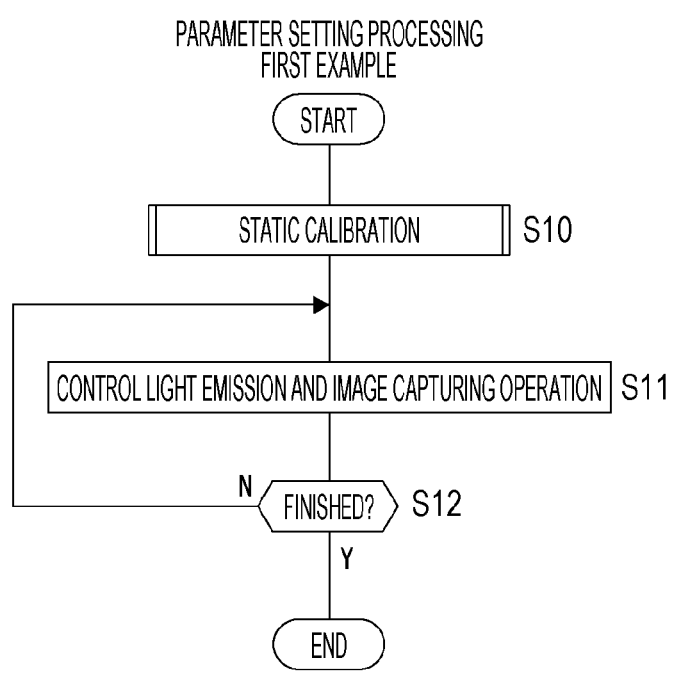
FIG. 27 is a flowchart of a first example of parameter adjustment processing according to the fourth embodiment.

To begin with, in the processing example of FIG. 27, the control unit 9 performs the above-described static parameter control in step S10 as static calibration.

Then in step S11, the control unit 9 controls the drive unit 3 and the image sensor 7 such that the light emitting unit 2 starts light emission and the image sensor 7 starts image capturing on the basis of the parameter adjusted by the static calibration.

When sensing is finished, the control unit 9 finishes the processing from step S12.

That is, the processing of FIG. 27 is a processing example to perform only the static parameter control.

Processing examples of I, II, and III as the static calibration in step S10 will be described in FIGS. 28, 29, and 30, respectively.

To begin with, the static calibration processing example I will be described in FIG. 28.

In step S200, the control unit 9 sets an initial parameter for the drive unit 3 and the image sensor 7. This is a parameter that designates the laser power and the light emission period Tp common to all the plurality of light emitting elements 2a.

Note that if the length of the light emission period Tp is the same, the initial parameter may be a parameter obtained by shifting the start timing Tst and the end timing Ted.

Furthermore, the initial parameter also includes a gain to be given to an image capturing signal on the image sensor 7 side and the exposure period Tr. As described above, the exposure period Tr is synchronized with the light emission period Tp.

Then, the control unit 9 performs light emission control in step S201. That is, the control unit 9 causes the drive unit 3 to start light emission, and causes the image sensor 7 to start exposure synchronized with the light emission.

With this operation, captured data is obtained on the image capturing device 101 side, and the control unit 9 enters a state where information on the captured data, that is, luminance data in each pixel or pixel block can be checked.

Therefore, in step S202, the control unit 9 acquires the luminance value of each pixel of the captured data.

In step S203, the control unit 9 confirms whether or not the pixel value (luminance value) can be detected in all the pixels required for distance measurement sensing.

Note that all the pixels required for sensing mean all the pixels that should receive the reflected light from the laser light emission, and do not necessarily refer to all the pixels physically provided in the image sensor 7. Hereinafter, in the description of FIGS. 28, 29, and 30, "all the pixels" are used in such meaning.

In step S203, the control unit 9 confirms whether or not at least light reception within a dynamic range of the image sensor 7 can be implemented in all the pixels.

That is, if the pixel value is not saturated and is not buried in noise, and an appropriate pixel value is obtained, at least the sensing operation is possible, and thus it is only required that light reception can be implemented within the dynamic range.

However, in step S203, conditions may be defined more strictly that all the pixels are within a predetermined luminance value range.

If all the pixels can be properly detected (not saturated and not buried in noise), sensing is possible, and thus the control unit 9 stores the current parameter in step S207 and finishes the static calibration. For example, in a case where there is no problem with the initial parameter, the static calibration will be finished with the initial parameter as it is.

Meanwhile, in a case where proper pixel detection cannot be performed in all or some of the pixels, (or in a case where the luminance value of some or all pixels is not within an appropriate range), the control unit 9 proceeds to step S204 to determine whether or not the sensor parameter is adjustable.

Here, for example, it is determined whether or not the gain to be given to the image capturing signal in the image sensor 7 is adjustable.

Note that in this case, it is also considered to adjust the exposure time Tr, and in a case where the exposure time Tr is adjusted, the light emission period Tp will be changed together at the same time. However, it is assumed that control of the light emission time Tp in this case is not performed on the individual light emitting element 2a, but is commonly performed on all the light emitting elements 2a.

In a case where the sensor parameter is adjustable as the gain or the exposure period, the control unit 9 proceeds to step S205 to change one or both of the gain or the exposure period.

In that state, the processing of steps S201, S202, and S203 is performed to determine whether or not proper pixel detection is implemented.

At this time point, the fact that all the pixels can be properly detected in step S203 means that the adjustment has been performed, particularly without the need to control the parameter of each light emitting element 2a individually.

In that case, in step S207, the control unit 9 stores the parameter in the state after adjusting the sensor parameter as the parameter after the static calibration.

In a case where it is not determined in step S203 that all the pixels can be detected, it may be determined in step S204 that the sensor parameter cannot be changed. This is a case, for example, where the gain or exposure time has reached the upper limit or lower limit that is determined in advance as a variable range.

In such a case, common control cannot be performed as sensor parameter adjustment, and thus the control unit 9 proceeds to step S206 to make individual light emission parameter adjustment.

That is, the control unit 9 changes the light emission parameter as shown in FIGS. 22C and 24. In particular, the light emission parameter is set according to the variation in the luminance of captured data.

The light emission parameter is set such that, for example, for the light emitting element 2a corresponding to a pixel (or pixel block) with insufficient luminance, the light emission period Tp is set long, and for the light emitting element 2a corresponding to a pixel (or pixel block) with too high luminance (or saturated), the light emission period Tp is set short.

Furthermore, it is also assumed that parameter setting will be performed to perform a plurality of light emissions (and exposures) in one frame period Tf.

In a case where the configuration allows the laser power to be controlled individually, the parameter of the laser power may be set individually.

Then, the processing of steps S201, S202, and S203 is performed with the set parameter to determine whether or not appropriate pixel detection is implemented.

In particular, by setting the light emission parameter individually, saturated pixels and pixels with insufficient luminance can be appropriately resolved. Of course, individual parameter setting may be made again in steps S203→S204→S206, and in that case, individual light emission parameter setting and the confirmation of captured data are repeated.

When the luminance of all the pixels can be properly detected in step S203, the control unit 9 proceeds to step S207, and stores the light emission parameter and the sensor parameter at that time point as parameters of the static calibration result.

By such processing, in a case where a luminance variation occurs in each pixel in the captured data, to begin with, overall parameter adjustment is performed, and if the variation cannot be still resolved, the individual parameter setting is performed.

The processing load is reduced by giving priority to overall control with simple parameter setting. Meanwhile, large variations can be handled by making individual setting.

Next, the static calibration processing example II will be described in FIG. 29. Note that processes already similar to processes of the processing example I are denoted with the same step numbers to avoid duplicate descriptions.

This is an example of prioritizing adjustment of the light emission parameter over adjustment of the sensor parameter.

In a case where it is determined in step S203 that the luminance values of all the pixels cannot be properly detected, the control unit 9 confirms in step S210 whether or not the light emission parameter is adjustable. Then, if adjustable, the control unit 9 proceeds to step S211 to make overall adjustment or individual adjustment to the light emission parameter. Then, the control unit 9 performs processing of steps S201, S202, and S203.

In a case where the light emission parameter is already not adjustable (adjustment limit has been reached) at the time point of proceeding to step S210, the control unit 9 proceeds to step S212 to adjust the sensor parameter. In this case, the gain adjustment in the image sensor 7 is performed.

Other processing is similar to the processing example I.

Figure 29:
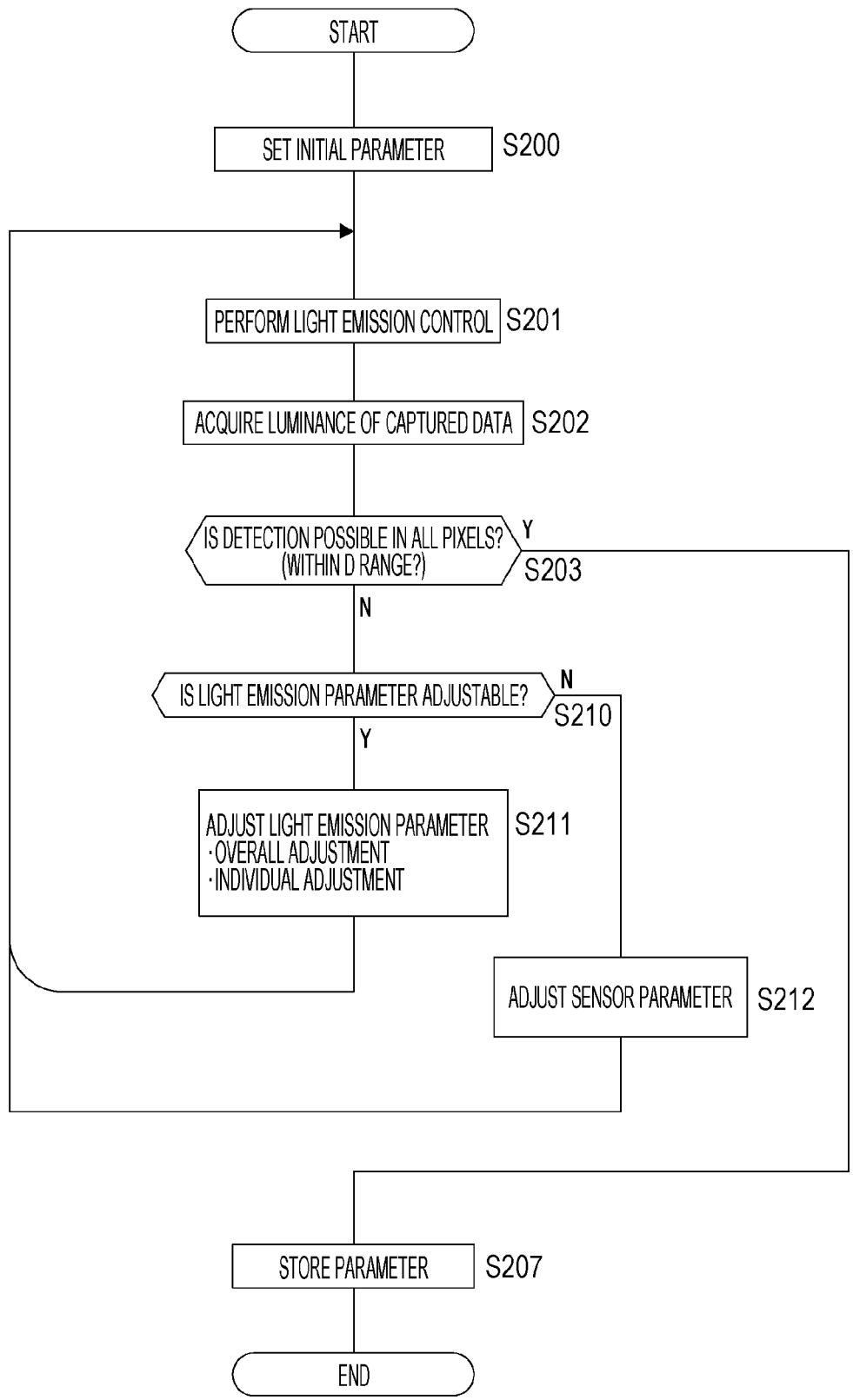
FIG. 29 is a flowchart of static calibration processing example II according to the fourth embodiment.

In the case of processing example II of FIG. 29, to begin with, individual parameter setting is performed. Therefore, even in a case where the luminance variation on the captured data is large, it is possible to set the parameter so as to efficiently equalize the luminance variation. The gain adjustment of the image sensor 7 is used as an auxiliary. This is suitable as processing in a case where it is not desired to adjust the gain of the image sensor so much due to noise during amplification and the like.

The static calibration processing example III will be described in FIG. 30. Steps S200 to S207 are similar to FIG. 28. However, step S203A has stricter conditions than step S203. That is, the condition does not mean that only all the pixels can be detected properly, but means that the luminance value of all the pixels is within a predetermined range. This means adjusting the parameter until the variation decreases.

Then, in this processing example III, after storing the parameter of the static calibration result in step S207, parameter adjustment is further performed for the laser power setting in steps S220 to S223.

To begin with, in step S220, the control unit 9 changes the light emission parameter such that the laser power is reduced by one step for all the light emitting elements 2a.

Note that one step here means one-step reduction amount set for the processing of step S220, and is not necessarily limited to a variable amount in terms of resolution of the laser power (drive current value) that can be set.

Then, in step S221, the control unit 9 controls the drive unit 3 such that the light emitting elements 2a emit light according to the changed light emission parameter, and in step S222, the control unit 9 acquires the luminance value of each pixel of the captured data captured corresponding to the light emission.

Then, in step S223, the control unit 9 determines whether or not all the pixels are detected with the luminance value equal to or higher than a predetermined value. The predetermined value is a luminance value at a level at which there is no problem in image detection and distance measurement sensing.

In a case where all the pixels are detected, the control unit 9 returns to step S207 and stores the current parameter including the laser power reduced in the immediately preceding step S220.

Then, in step S220, the control unit 9 further reduces the laser power by one step, and performs the processing of steps S221, S222, and S223.

That is, as long as the luminance value equal to or higher than a predetermined value is detected in all the pixels in step S step S223, the laser power is reduced.

If the luminance value of some pixel becomes less than the predetermined value in step S223, the process is finished at the time point.

The parameter stored at this time is a parameter in a case where the luminance value becomes equal to or higher than the predetermined value in all the pixels immediately before the luminance value becomes less than the predetermined value in some pixel. That is, the parameter indicates a state where the laser power is reduced as much as possible.

Figure 30:
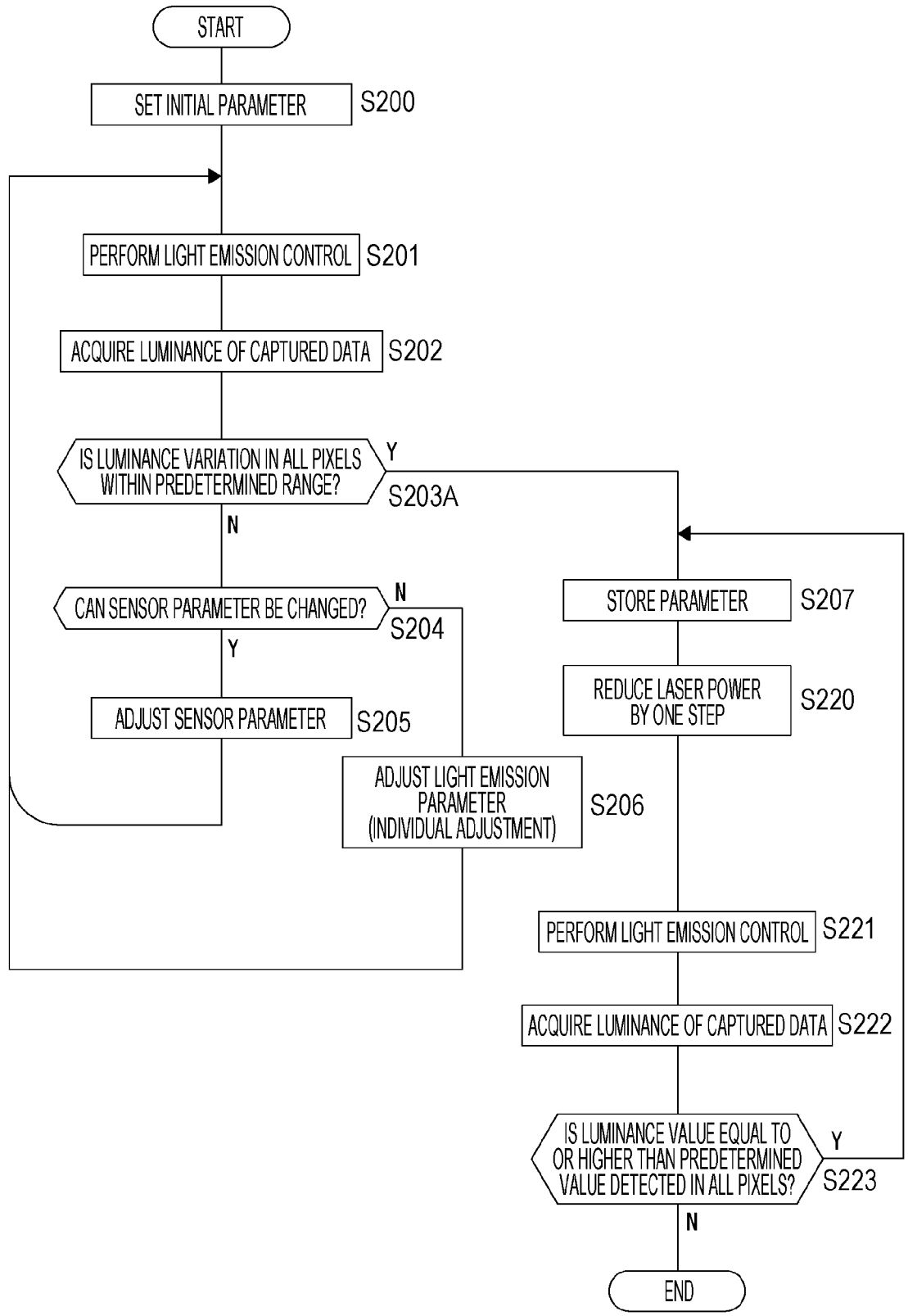
FIG. 30 is a flowchart of static calibration processing example III according to the fourth embodiment.

Therefore, in the processing of FIG. 30, the static calibration is to reduce the laser power as much as possible while inhibiting the luminance variation in each pixel of the captured data as much as possible (inhibit to the appropriate range in step S203A).

Note that the predetermined value used as a threshold in step S223 is preferably set with a certain margin from a value at which detection becomes impossible.

By such processing, the laser power can be reduced as much as possible within the range where appropriate sensing can be performed, and power consumption can be reduced and luminous efficiency can be improved.

Figure 28:
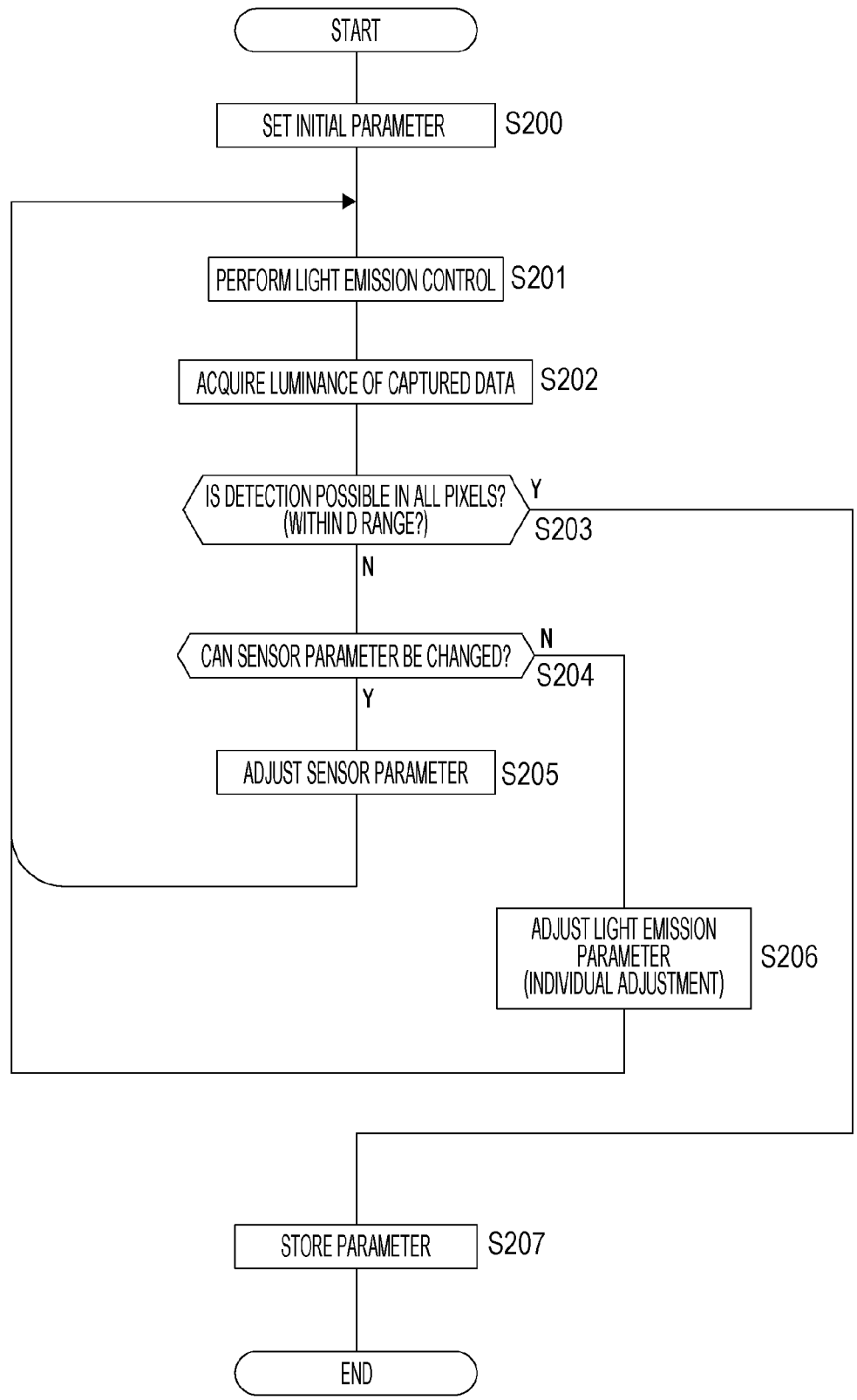
FIG. 28 is a flowchart of static calibration processing example I according to the fourth embodiment.

Note that FIG. 30 is based on the processing of FIG. 28 with steps S220 to S223 added, but a processing example based on the processing of FIG. 29 with steps S220 to S223 added can also be considered.

The above static calibration processing examples I, II, and III have been described as step S10 in the first example of the parameter setting processing of FIG. 27. A second example as parameter setting processing in which such static calibration processing examples I, II, and III can be adopted will be described subsequently.

FIG. 31 shows a second example of parameter setting processing.

In this processing example, the control unit 9 performs the static calibration in step S10, and then measures the temperature in step S21. That is, the control unit 9 checks the current temperature TMP from the temperature detection signal by a temperature detecting unit 10.

Then, the control unit 9 performs calibration according to the temperature in step S22.

Thereafter, in step S23, the control unit 9 controls the drive unit 3 and the image sensor 7 such that the light emitting unit 2 starts light emission and the image sensor 7 starts image capturing on the basis of the parameter adjusted by the static calibration and the further calibration according to the temperature.

During sensing, steps S21, S22, and S23 are continuously performed, and when the sensing is finished, the control unit 9 finishes the processing from step S12.

That is, the processing of FIG. 31 is an example of performing temperature calibration as the dynamic parameter control in addition to the static parameter control.

The temperature calibration in step S22 is, for example, to control the laser power (drive current amount) according to the current temperature TMP.

To respond to the decrease in luminous efficiency as the temperature rises, it is considered to increase the drive current amount according to the temperature rise to maintain the amount of emitted light.

Note that in this calibration according to the temperature, the drive current amount may be changed as overall control for all the light emitting elements 2a, but the drive current amount may be controlled individually (for each block) according to the temperature distribution.

Moreover, in this case, the parameter may be set so as to perform a divided plurality of light emissions within one frame described above.

In particular, because of the calibration according to the temperature rise, in order to avoid higher temperature rise as much as possible, by performing a plurality of light emissions and exposures in one frame period Tf, it is preferable in that the temperature rise is not promoted while ensuring the amount of light.

Next, a third example of parameter setting processing will be described in FIG. 32.

Steps S10, S21, S22 and S23 are similar to FIG. 31. In this example, the control unit 9 adjusts one or both of the light emission parameter and the sensor parameter in step S24 according to the brightness appeared in the captured data.

During sensing, steps S21, S22, S23, and S24 are continuously performed, and when sensing is finished, the control unit 9 finishes the processing from step S12.

That is, the processing of FIG. 32 is an example of performing temperature calibration and calibration according to reflectance of the subject S as dynamic parameter control in addition to static parameter control.

As the light emission parameter adjustment, the light emission period and the laser power are controlled within a non-saturating range according to the change in the reflectance and the distance of the subject S. This can be an overall adjustment of the light emitting elements 2a or individual adjustment. For example, in a case where the reflectance is high in a part of the subject S, the light emission period Tp is shortened for the corresponding light emitting element 2a, and the like.

As the sensor parameter adjustment, gain adjustment and exposure period adjustment are performed within a non-saturating range according to the change in the reflectance and the distance of the subject S.

The static parameter control and the dynamic parameter control are performed by the above various processing examples, whereby captured data with little luminance variation can be obtained and the sensing precision can be improved.

11. Conclusion and Modified Example

In the above embodiments, the following effects can be obtained.

A light source device 100 according to the embodiments includes: a plurality of laser light emitting elements 2a; and a drive unit 3 configured to drive each of the laser light emitting elements 2a to perform a plurality of light emissions in one frame period in an image sensor 7 that receives and captures light emitted from the plurality of laser light emitting elements 2a and reflected by a subject S.

If the period length in which laser light emission is continuously performed is divided into a plurality of times and laser light emission is performed, the temperature rise in each light emission period Tp is inhibited, and the temperature drop occurs in a non-light emission period. That is, even if the light emission is performed for the same period length integrally, a plurality of light emissions allows the temperature rise to be inhibited more than in a case where light emission is performed continuously.

Therefore, for example, even in a case where luminance is insufficient on the image sensor side and the like, by driving a plurality of light emissions, an amount of light exposure can be increased without causing temperature rise. With this configuration, appropriate exposure on the image sensor 7 side can be implemented, and coordinate detection precision for sensing is improved, thereby improving precision of distance and shape sensing.

Moreover, by inhibiting the temperature rise, it is possible to prevent an output from decreasing due to the temperature rise, contributing to improvement in luminous efficiency.

Furthermore, the technology of the embodiments enables calculation of a distance and the like from one piece of image obtained by accumulating a plurality of light emissions, and the exposure period on the image sensor 7 side can be adjusted on the image sensor 7 side. This brings an advantage that light emission with an arbitrary cycle and pulse width can be used on the light source device side according to conditions such as heat generation and ambient temperature.

Note that by always performing a plurality of light emissions in one frame, it is possible to implement the light source device 100 that effectively inhibits the temperature rise.

Figure 20:
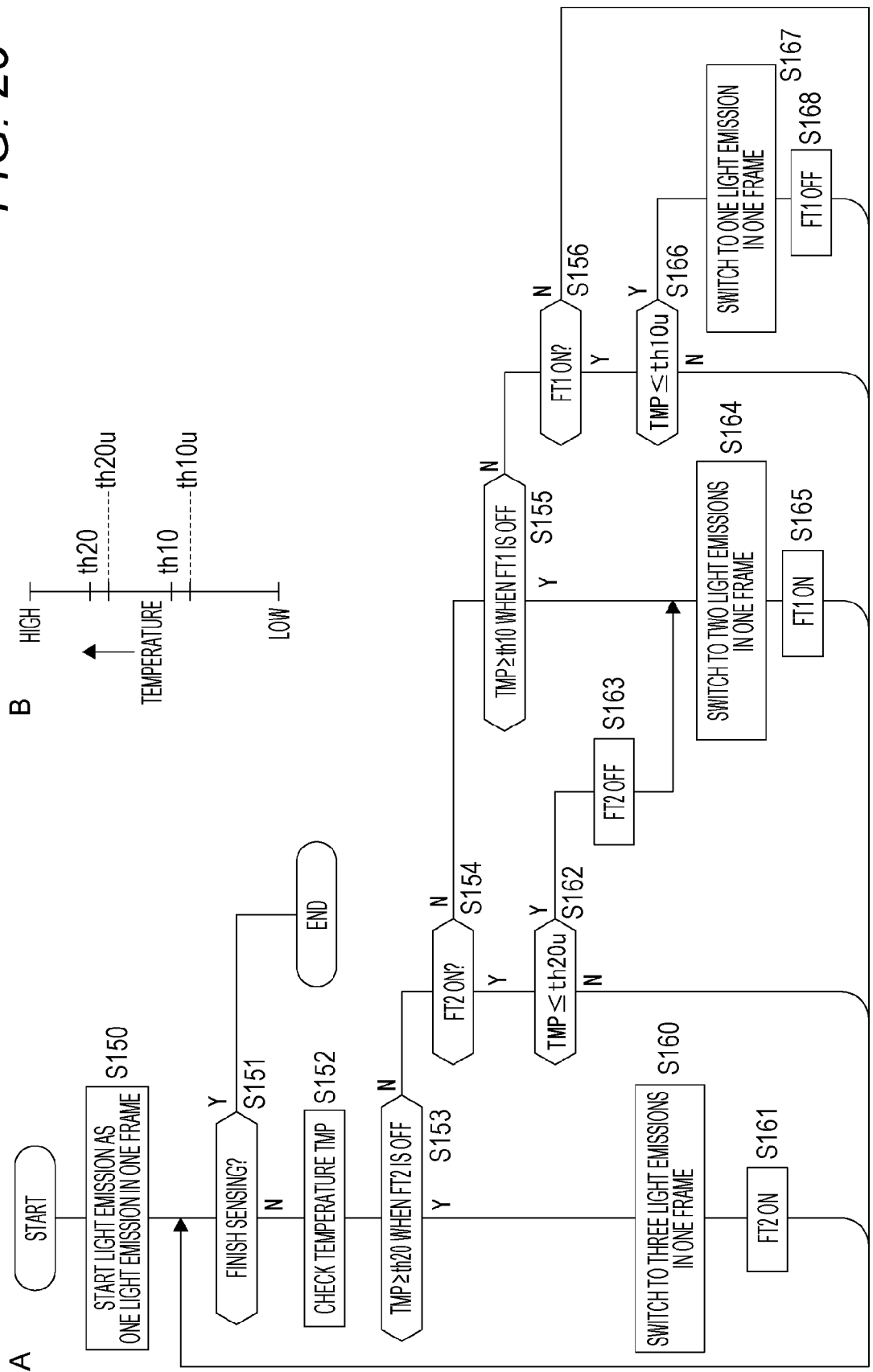
FIG. 20 is a flowchart and an explanatory diagram of a threshold of a second example according to the second embodiment.

Meanwhile, as in the example described in FIG. 20, it is considered to normally perform one relatively long light emission in one frame period, and to perform a plurality of relatively short light emissions in one frame period only when necessary. In some cases, this may reduce the increase in processing load caused by the plurality of light emissions.

In the embodiments, an example has been described in which the drive unit 3 changes the number of light emissions of the laser light emitting elements 2a in one frame period according to a temperature detection result (see FIGS. 19 and 20).

By always performing a plurality of light emissions in one frame, the temperature rise can be effectively inhibited, but it may be advantageous to continuously perform laser light emission and to continuously perform exposure on the image sensor 7 side in terms of lighter processing load.

Therefore, in a period when there is no particular problem, that is, in a period when the temperature is not high, one light emission is performed in one frame period. Then, when necessary, switching is performed to a plurality of light emissions in one frame. This enables inhibition of temperature rise and appropriate sensing continuously.

In the embodiments, an example has been described in which the drive unit 3 changes the number of light emissions of the laser light emitting elements 2a as a plurality of light emissions in one frame period according to a temperature detection result (see FIG. 20).

For example, depending on temperature conditions, the number of emissions as the plurality of light emissions is switched, such as two light emissions or three light emissions in one frame period.

Since the light emission period length, emission interval, and the like differ depending on the number of light emissions in one frame period, the effect of inhibiting the temperature rise can be made different. Therefore, even in a case where a plurality of light emissions is used, the number of light emissions is switched according to temperature conditions.

For example, if the temperature rises a little, two light emissions are performed, and if the temperature rises further, three light emissions are performed. With this configuration, the effect of inhibiting the temperature rise can be gradually increased to maintain a normal state.

In the embodiments, the laser light emitting elements 2a include vertical cavity surface emitting lasers (VCSEL).

By driving the laser light emitting elements 2a as VCSEL a plurality of times in one frame, it is possible to implement the light source device 100 that can appropriately cope with the temperature rise.

Note that the technology of the present disclosure can be applied not only to VCSEL but also to light source devices equipped with other types of laser light emitting elements.

The light source device 100 according to the embodiments further includes a temperature sensor 10a (temperature detecting unit 10) configured to detect a temperature near the laser light emitting elements 2a.

For example, the temperature sensor 10a is disposed near the laser light emitting elements 2a as VCSEL.

With this configuration, the temperature of the laser light emitting elements 2a (for example, mesa temperature near the laser light emitting elements 2a) can be obtained, and the appropriate number of light emissions can be controlled accordingly.

Furthermore, the temperature distribution on a light emitting surface can also be detected by disposing the temperature sensor 10a. With this configuration, it is considered to control driving at a different number of light emissions according to locations where the laser light emitting elements 2a are arranged in the plane.

In the embodiments, an example has been described in which a temperature sensor 10a configured to detect a temperature near the laser light emitting elements 2a is further provided, and the drive unit 3 performs light emission suspension and light emission resumption of the laser light emitting elements in one frame period according to a detection result of the temperature sensor 10a.

For example, by performing the drive control such as in FIG. 19, a plurality of light emissions of the laser light emitting elements 2a according to the temperature condition will be performed. In particular, by using the temperature condition as a reference for suspending and resuming light emission, this is suitable for the purpose of controlling the temperature.

In the embodiments, an example has been described in which the drive unit 3 drives each of the laser light emitting elements according to a light emission parameter that defines a light emission operation of the laser light emitting elements 2a per predetermined unit.

The drive unit 3 can flexibly perform laser control according to various circumstances because of the configuration that allows driving with the light emission parameter set for each of the light emitting elements 2a of the predetermined unit. For example, it is possible to perform control such as performing a plurality of light emissions in one frame only for the laser light emitting element 2a of a specific block. For example, in a case where in-plane distribution is detected by the temperature sensor 10a, it is possible to make the temperature uniform by performing a plurality of light emissions only for some of the laser light emitting elements 2a accordingly, and the like.

It is considered that the light source device 100 according to the embodiments has a configuration in which the drive unit 3 drives each of the laser light emitting elements according to a light emission parameter that defines a light emission operation of the laser light emitting elements 2a, and the light source device 100 includes a control unit 9 configured to generate the light emission parameter.

That is, the control unit 9 is provided in the light source device 100 (for example, in a chip as the light source device 100).

Since the control unit 9 is integrated with the light emitting unit 2 and the drive unit 3 as the light source device 100 (for example, in the same chip), it is possible to have a configuration advantageous for setting and transferring the light emission parameter.

In the embodiments, an example has been described in which the drive unit 3 controls duration time (light emission periods Tp1, Tp2, . . . ) of one light emission of the plurality of light emissions with a set light emission parameter.

A temperature rise occurs during the light emission period. By controlling the length of each light emission period in a plurality of light emissions, the period length in which the temperature rise occurs is controlled, and therefore, by controlling the light emission period length, it is possible to emit light suitable for the temperature condition.

In the embodiments, an example has been described in which the drive unit 3 controls a light emission interval (non-light emission period) of the plurality of light emissions with a set light emission parameter.

The non-light emission period is a period in which the temperature drops. By controlling the light emission interval in a plurality of light emissions, the period length in which the temperature drop occurs is controlled, and therefore, by controlling the light emission interval, it is possible to emit light suitable for the temperature condition.

An image sensor 7 according to the embodiments includes a photoelectric conversion unit 51 configured, in a case where a plurality of laser light emitting elements 2a of a light source device 100 performs a plurality of light emissions in one frame period in which a captured image is generated, to perform exposure to light emitted from the laser light emitting elements 2a and reflected by a subject S in an exposure period Tr corresponding to a period Tp of each of the plurality of light emissions. Then, one-frame captured data obtained by a plurality of exposures is output.

With this configuration, on the image sensor 7 side it is possible to accurately perform exposure to the reflected light emitted by the light emission of the laser light emitting elements 2a. In particular, in order to implement the effect of inhibiting the temperature rise by the plurality of light emissions on the light source device 100 side, the image capturing device 101 will also perform a collaboration operation.

Then, with this configuration, the luminance on the captured image can be controlled to a desired value, and for example, it is possible to provide the image capturing device that can accurately perform image capturing for distance measurement, 3D shape estimation of an object, and the like.

In this case, an example has been cited in which the image sensor 7 further includes a charge holding unit 52 configured to hold a charge by the exposure of the photoelectric conversion unit 51 according to the period of each of the plurality of light emissions of the laser light emitting elements 2a in one frame period, and a charge signal that generates one image in each frame period is read from the charge holding unit 52 (see FIG. 15).

With this configuration, it is possible to output the charge signal for generating one-frame captured data in response to time-division exposure of the photoelectric conversion unit.

Then, the distance and the like can be calculated from one piece of image obtained by accumulating the plurality of light emissions.

Furthermore, the photoelectric conversion unit 51 allows settings of an operation of performing exposure corresponding to a period of each of the plurality of light emissions in one frame, and an operation of performing exposure corresponding to a period of a part of the plurality of light emissions.

That is, as described in FIG. 21, the operation of performing exposure corresponding to a period of each of the plurality of light emissions of the laser light emitting elements and the operation of performing exposure in a period of a part of the plurality of light emissions can be selectively performed.

For example, in a case where sensitivity is low, it is possible to perform control such as increasing the number of exposures or decreasing the number of exposures in order to prevent saturation. With such control, the luminance of the captured data can be made uniform, and improvement in detection precision can be promoted.

In particular, the image sensor 7 of the embodiments does not need to make
the exposure duration time per one time and
the number of exposures
identical to those on the light emitting side. Therefore, it is possible to control these individually within the image sensor plane, and it is possible to control the bright spot caused by the reflected light of the light source in the obtained image to have desired luminance.

Note that the photoelectric conversion unit 51 may be configured to set the number of exposures corresponding to a period of each of the plurality of light emissions in one frame per predetermined pixel unit.

For example, the operation of performing exposure every time corresponding to a period of each of the plurality of light emissions of the laser light emitting elements 2a and the operation of performing exposure in a period of a part of the plurality of light emissions can be selectively performed per predetermined pixel unit. The predetermined pixel unit mentioned here is a unit of one pixel, a unit of a blocked plurality of pixels, and the like.

With this configuration, the exposure time can be changed in the image capturing surface of the image sensor 7, and the luminance of the obtained image can be controlled to be desired luminance.

Therefore, for example, for a pixel in a region where sensitivity is low, it is possible to perform control to increase the number of exposures, and for a pixel with high sensitivity, it is possible to perform control to decrease the number of exposures in order to prevent saturation. With such control, the luminance of the captured data can be made uniform, and improvement in detection precision can be promoted.

The distance measuring device 1 of the embodiments can be configured as a sensing module. This sensing module includes: a plurality of laser light emitting elements 2a; a drive unit 3 configured to drive each of the laser light emitting elements 2a to perform a plurality of light emissions in one frame period in an image sensor 7 that receives and captures light emitted from the plurality of laser light emitting elements 2a and reflected by a subject S; and the image sensor 7 including a photoelectric conversion unit 51 configured to perform exposure to the light emitted from the laser light emitting elements 2a and reflected by the subject in an exposure period corresponding to a period of each of the plurality of light emissions, the image sensor 7 outputting one-frame captured data obtained by a plurality of the exposures.

With this configuration, for example, the sensing module that performs distance measurement, object recognition, and the like is implemented. Moreover, in this case, the light source performs a plurality of light emissions in order to obtain one-time captured image, the 3D shape of the object is estimated by using one piece of captured image generated by accumulating the reflected light a plurality of times, and sensing precision can be improved by performing sufficient exposure while inhibiting the temperature rise.

In particular, the sensing module according to the embodiments as the distance measuring device 1 includes a temperature sensor 10a (temperature detecting unit 10) configured to detect a temperature near the laser light emitting elements 2a. The drive unit 3 changes the number of light emissions of the laser light emitting elements in one frame period according to a temperature detection result by the temperature sensor 10a.

With this configuration, it is possible to appropriately perform a plurality of light emissions in one frame period according to the temperature rise.

Note that the technology of the present disclosure is not limited to the configuration and processing examples of the embodiments, and various modified examples are assumed.

Furthermore, effects described in the present specification are merely illustrative and not restrictive, and other effects may be produced.

Note that the present technology can also have the following configurations.

(1)
A light source device including:
a plurality of laser light emitting elements; and
a drive unit configured to drive each of the laser light emitting elements to perform a plurality of light emissions in one frame period in an image sensor that receives and captures light emitted from the plurality of laser light emitting elements and reflected by a subject.

(2)
The light source device according to (1) described above, in which
the drive unit changes a number of light emissions of the laser light emitting elements in one frame period according to a temperature detection result.

(3)
The light source device according to (1) or (2) described above, in which
the drive unit changes a number of light emissions of the laser light emitting elements as a plurality of light emissions in one frame period according to a temperature detection result.

(4)
The light source device according to any one of (1) to (3) described above, in which
the laser light emitting elements include vertical cavity surface emitting lasers.

(5)
The light source device according to any one of (1) to (4) described above, further including
a temperature sensor configured to detect a temperature near the laser light emitting elements.

(6)
The light source device according to any one of (1) to (5) described above, further including
a temperature sensor configured to detect a temperature near the laser light emitting elements,
in which the drive unit performs light emission suspension and light emission resumption of the laser light emitting elements in one frame period according to a detection result of the temperature sensor.

(7)
The light source device according to any one of (1) to (6) described above, in which
the drive unit drives each of the laser light emitting elements according to a light emission parameter that defines a light emission operation of the laser light emitting elements per predetermined unit.

(8)
The light source device according to any one of (1) to (7) described above, in which
the drive unit drives each of the laser light emitting elements according to a light emission parameter that defines a light emission operation of the laser light emitting elements, and
the light source device includes a control unit configured to generate the light emission parameter.

(9)
The light source device according to any one of (1) to (8) described above, in which
the drive unit controls duration time of one light emission of the plurality of light emissions with a set light emission parameter.

(10)
The light source device according to any one of (1) to (9) described above, in which
the drive unit controls a light emission interval of the plurality of light emissions with a set light emission parameter.

(11)
An image sensor including
a photoelectric conversion unit configured, in a case where a plurality of laser light emitting elements of a light source device performs a plurality of light emissions in one frame period in which a captured image is generated, to perform exposure to light emitted from the laser light emitting elements and reflected by a subject in an exposure period corresponding to a period of each of the plurality of light emissions,
in which the image sensor outputs one-frame captured data obtained by a plurality of exposures.

(12)
The image sensor according to (11) described above, further including
a charge holding unit configured to hold a charge by the exposure of the photoelectric conversion unit according to the period of each of the plurality of light emissions of the laser light emitting elements in one frame period,
in which a charge signal that generates one image in each frame period is read from the charge holding unit.

(13)
The image sensor according to (11) or (12) described above, in which
the photoelectric conversion unit allows settings of
an operation of performing exposure corresponding to a period of each of the plurality of light emissions in one frame, and
an operation of performing exposure corresponding to a period of a part of the plurality of light emissions.

(14)
A sensing module including:
a plurality of laser light emitting elements;
a drive unit configured to drive each of the laser light emitting elements to perform a plurality of light emissions in one frame period in an image sensor that receives and captures light emitted from the plurality of laser light emitting elements and reflected by a subject; and
the image sensor including a photoelectric conversion unit configured to perform exposure to the light emitted from the laser light emitting elements and reflected by the subject in an exposure period corresponding to a period of each of the plurality of light emissions, the image sensor outputting one-frame captured data obtained by a plurality of the exposures.

(15)
The sensing module according to (14) described above, further including
a temperature sensor configured to detect a temperature near the laser light emitting elements,
in which the drive unit changes a number of light emissions of the laser light emitting elements in one frame period according to a temperature detection result by the temperature sensor.

REFERENCE SIGNS LIST

1 Distance measuring device
2 Light emitting unit
2a Light emitting element
3 Drive unit 4 Power circuit
5 Light emission side optical system
6 Image capturing side optical system
7 Image sensor
8 Image processing unit
9 Control unit
9a Distance measuring unit
10 Temperature detecting unit
10a Temperature sensor
100 Light source device
101 Image capturing device

The invention claimed is:

1. A light source device comprising:
a plurality of laser light emitting elements; and
a drive unit configured to drive the laser light emitting elements to emit a plurality of light pulses in one frame period of a pixelated image sensor configured to receive and capture light emitted from the plurality of laser light emitting elements and reflected by a subject,
wherein the pixelated image sensor is configured to generate a synchronization signal for the plurality of laser light emitting elements to synchronize the plurality of light pulses with a corresponding plurality of exposure periods in the one frame period of the pixelated image sensor; and
wherein, in response to the synchronization signal, the drive circuit is configured to synchronize the plurality of light pulses with the corresponding plurality of exposure periods in the one frame period of the pixelated image sensor.

2. The light source device according to claim 1, wherein the drive unit is further configured to change a number of the light pulses of the laser light emitting elements in the one frame period of the pixelated image sensor according to a temperature detection result.

3. The light source device according to claim 1, wherein the laser light emitting elements include vertical cavity surface emitting lasers.

4. The light source device according to claim 1, further comprising
a temperature sensor configured to detect a temperature in a chip near the laser light emitting elements therein.

5. The light source device according to claim 1, further comprising
a temperature sensor configured to detect a temperature near the laser light emitting elements,
wherein the drive unit is further configured to change a cycle of the light pulses of the laser light emitting elements in the one frame period of the pixelated image sensor according to a detection result of the temperature sensor.

6. The light source device according to claim 1, wherein the drive unit is further configured to drive each of the laser light emitting elements according to a light emission parameter defining a light emission operation of the laser light emitting elements per predetermined unit.

7. The light source device according to claim 1, wherein the drive unit is further configured to drive each of the laser light emitting elements according to a light emission parameter defining a light emission operation of the laser light emitting elements, and
the light source device comprises a control unit configured to generate the light emission parameter.

8. The light source device according to claim 1, wherein the drive unit is further configured to control duration time of one light pulse of the plurality of light pulses using a set light emission parameter.

9. The light source device according to claim 1, wherein the drive unit is further configured to control a light emission interval of the plurality of light pulses using a set light emission parameter.

10. An image sensor, comprising
a pixelated image sensor including a photoelectric conversion unit configured, in a case where a plurality of laser light emitting elements of a light source device emits a plurality of light pulses in one frame period in which a captured image is generated by the pixelated image sensor, to perform exposure to light emitted from the laser light emitting elements and reflected by a subject in an exposure period corresponding to a period of the light pulses,
wherein the pixelated image sensor is configured to output data of one-frame captured image obtained using a plurality of the exposure periods; and
wherein the pixelated image sensor is further configured to generate a synchronization signal for the light source to synchronize the plurality of light pulses with a corresponding plurality of exposure periods in the one frame period of the pixelated image sensor.

11. The image sensor according to claim 10, further comprising
a charge holding unit configured to hold a charge by the exposure of the photoelectric conversion unit according to the period of the light pulses of the laser light emitting elements in one frame period of the pixelated image sensor,
wherein a charge signal corresponding to one image in each frame period of the pixelated image sensor is read from the charge holding unit.

12. The image sensor according to claim 10, wherein the photoelectric conversion unit allows settings of:
an operation of performing exposure corresponding to the period of light pulses in one frame period of the pixelated image sensor, and
an operation of performing exposure corresponding to a part of the period of the light pulses.

13. A sensing module, comprising:
a plurality of laser light emitting elements;
a drive unit configured to drive each of the laser light emitting elements to emit a plurality of light pulses in one frame period of a pixelated image sensor configured to receive and capture light emitted from the plurality of laser light emitting elements and reflected by a subject; and
the pixelated image sensor including a photoelectric conversion unit configured to perform exposure to the light emitted from the laser light emitting elements and reflected by the subject in an exposure period corresponding to a period of the light pulses, the pixelated image sensor outputting data of one-frame captured image data obtained by a plurality of the exposure periods; and
wherein the pixelated image sensor is configured to generate a synchronization signal for the plurality of laser light emitting elements to synchronize the plurality of light pulses with a corresponding plurality of exposure periods in the one frame period of the pixelated image sensor.

14. The sensing module according to claim 13, further comprising
a temperature sensor configured to detect a temperature near the laser light emitting elements,
wherein the drive unit is further configured to change a number of the light pulses of the laser light emitting elements in one frame period of the pixelated image sensor according to a temperature detection result by the temperature sensor.

* * * * *